(12) United States Patent
Kawashima et al.

(10) Patent No.: US 10,217,872 B2
(45) Date of Patent: Feb. 26, 2019

(54) SEMICONDUCTOR DEVICE AND ITS MANUFACTURING METHOD

(71) Applicant: Renesas Electronics Corporation, Koutou-ku, Tokyo (JP)

(72) Inventors: Yoshiyuki Kawashima, Tokyo (JP); Masao Inoue, Tokyo (JP); Atsushi Yoshitomi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/626,092

(22) Filed: Jun. 17, 2017

(65) Prior Publication Data
US 2018/0061997 A1 Mar. 1, 2018

(30) Foreign Application Priority Data

Aug. 31, 2016 (JP) ................. 2016-168823

(51) Int. Cl.
*H01L 29/423* (2006.01)
*H01L 29/792* (2006.01)
*H01L 29/49* (2006.01)
*H01L 29/66* (2006.01)
*H01L 21/28* (2006.01)
*H01L 29/78* (2006.01)
(Continued)

(52) U.S. Cl.
CPC ...... *H01L 29/792* (2013.01); *H01L 21/28282* (2013.01); *H01L 27/1157* (2013.01); *H01L 27/11573* (2013.01); *H01L 29/42344* (2013.01); *H01L 29/42376* (2013.01); *H01L 29/4966* (2013.01); *H01L 29/66545* (2013.01); *H01L 29/66833* (2013.01); *H01L 29/785* (2013.01)

(58) Field of Classification Search
CPC .................................. H01L 29/42344
See application file for complete search history.

(56) References Cited

U.S. PATENT DOCUMENTS 7,872,298 B2 1/2011 Shimamoto et al.
8,716,089 B1* 5/2014 Hall ................. H01L 29/42344
257/E21.691
(Continued)

FOREIGN PATENT DOCUMENTS

JP 2008-041832 A 2/2008

*Primary Examiner* — Peniel M Gumedzoe
*Assistant Examiner* — Christopher A Johnson
(74) *Attorney, Agent, or Firm* — Shapiro, Gabor and Rosenberger, PLLC

(57) ABSTRACT

A memory cell includes a control gate electrode and a memory gate electrode. The control gate electrode is formed over the upper surface and the sidewall of a fin FA including apart of a semiconductor substrate. The memory gate electrode is formed over one side surface of the control gate electrode and the upper surface and the sidewall of the fin through an ONO film, in a position adjacent to the one side surface of the control gate electrode. Further, the control gate electrode and the memory gate electrode are formed of n-type polycrystalline silicon. A first metal film is provided between the gate electrode and the control gate electrode. A second metal film is provided between the ONO film and the memory gate electrode. A work function of the first metal film is greater than a work function of the second metal film.

10 Claims, 25 Drawing Sheets

(51) Int. Cl.
*H01L 27/1157* (2017.01)
*H01L 27/11573* (2017.01)

(56) References Cited

U.S. PATENT DOCUMENTS

| | | | | |
|---|---|---|---|---|
| 2010/0025755 A1* | 2/2010 | Terai | ................ | H01L 21/28282 |
| | | | | 257/326 |
| 2010/0193857 A1* | 8/2010 | Nakagawa | ........ | H01L 27/11521 |
| | | | | 257/324 |
| 2011/0039385 A1* | 2/2011 | Shimamoto | ....... | H01L 21/28282 |
| | | | | 438/287 |

* cited by examiner (V. Misra et. al., Topical Research Conference on Reliability, 2003)

SEMICONDUCTOR DEVICE AND ITS MANUFACTURING METHOD

CROSS-REFERENCE TO RELATED APPLICATIONS

The disclosure of Japanese Patent Application No. 2016-168823 filed on Aug. 31, 2016 including the specification, drawings and abstract is incorporated herein by reference in its entirety.

The present invention relates to a semiconductor device and a manufacturing method therefor, and is preferably applicable to a semiconductor device, having a fin-type transistor (FINFET: Fin Field Effect Transistor) which is configured with, for example, a semiconductor unit in a Fin shape, and its manufacturing method.

BACKGROUND

Japanese Unexamined Patent Application Publication No. 2008-41832 discloses a memory cell of a non-volatile memory having an insulating film, which is configured with an insulating film formed from silicon nitride or silicon oxynitride and a metal element-containing layer formed from metal oxide or metal silicate, between a semiconductor substrate and a selection gate electrode.

SUMMARY

In a split gate-type memory cell having a fin-type channel, the width of a depletion layer depends on the width of the fin. Thus, it has a problem that a threshold voltage decreases, as the width of the fin gets small. As a countermeasure for this, it is considered to increase the impurity concentration of the fin. However, the resistance of the channel is increased, and its mobility decreases, thus resulting in a decrease in the driving force.

Other objects and new features will be apparent from the descriptions of the present specification and the accompanying drawings.

According to one embodiment, there is provided a semiconductor device having a control gate electrode, a memory gate electrode, and a second insulating film. The control gate electrode is formed over an upper surface and a sidewall of fins including a part of a semiconductor substrate, through a first insulating film. The memory gate electrode is formed adjacent to one side surface of the control gate electrode. The second insulating film which is formed between the control gate electrode and the memory gate electrode and between the fins and the memory gate electrode, and includes a charge accumulation film. The control gate electrode and the memory gate electrode are formed from n-type polycrystalline silicon. A first metal film is provided between the first insulating film and the control gate electrode. A second metal film is provided between the second insulating film and the memory gate electrode. A work function of the first metal film is greater than a work function of the second metal film.

According to another embodiment, there is provided a method of manufacturing a semiconductor device, including the following steps of: forming a plurality of fins including a part of a semiconductor substrate; forming an element isolation region by forming an insulating film buried between fins adjacent to each other; and forming a first insulating film, a first metal film, and a control gate electrode which are sequentially laminated over an upper surface and a sidewall of the fins. Further, there is a step of forming a second insulating film including a charge accumulation film, a second metal film, and a memory gate electrode formed from n-type polycrystalline silicon, which are sequentially laminated over a side surface of the control gate electrode and an upper surface and a sidewall of the fins, in a position adjacent to one side surface of the control gate electrode. A work function of the first metal film is greater than a work function of the second metal film.

According to the one embodiment, it is possible to prevent degradation of operation characteristics of the semiconductor device due to high integration.

DETAILED DESCRIPTION

Figure 1:
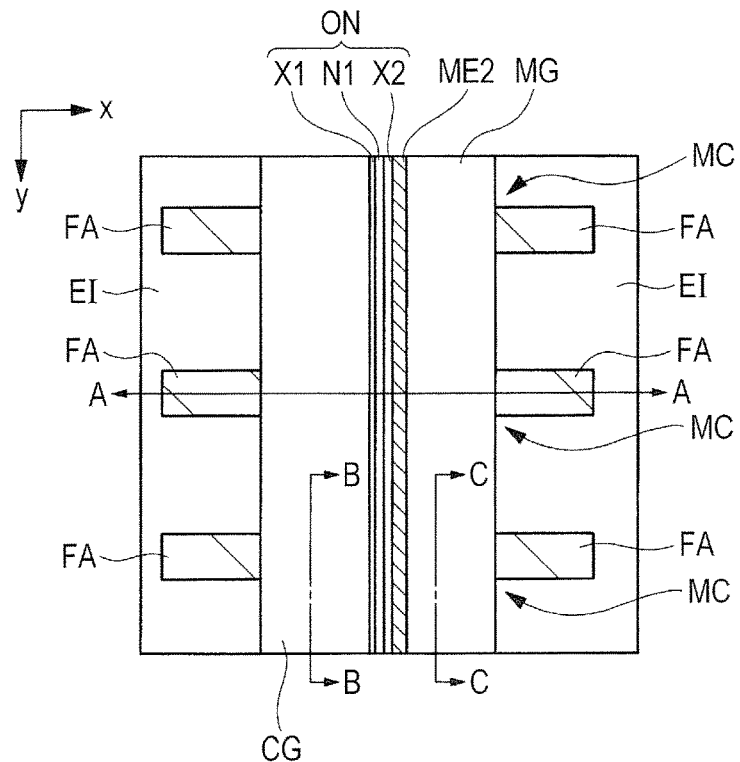
FIG. 1 is s plan view showing a memory cell region of a semiconductor device according to an embodiment.

In the following preferred embodiment, if necessary for convenience sake, descriptions will be made to divided plural sections or preferred embodiments, however, unless otherwise specified, they are not mutually irrelevant, but one is in relations of modifications, application examples, details, supplementary explanations of a part or whole of the other.

In the following preferred embodiments, in the case of reference to the number of an element (including quantity, numeric value, amount, range), unless otherwise specified and unless clearly limited in principle, the present invention is not limited to the specified number, and a number over or below the specified one may be used.

In the following preferred embodiments, needless to say, the constituent elements (including element steps) are not necessarily indispensable, unless otherwise specified and unless considered that they are obviously required in principle.

In the following preferred embodiment, for the constituent elements, needless to say, each of those terms "formed from A", "formed of A", "has A", and "include A" is not to exclude any other elements, unless specified that only the element is included. Similarly, in the following preferred embodiment, in the reference of the forms of the constituent elements or the positional relationships, they intend to include those approximating or similar substantially to the forms and like, unless otherwise specified and unless considered that they are obviously not required in principle. This is also true of the foregoing numerical values and range.

Descriptions will now specifically be made to the preferred embodiment of the present invention based on the accompanying drawings. In the entire illustrations for describing the preferred embodiment, those members having the same function are identified by the same reference numerals, and are not described repeatedly over and over. For the sake of simply illustration, a particular part may be relatively largely illustrated. Even when a cross sectional view and a plan view correspond to each other, some part may be relatively largely illustrated, for the sake of simple illustration. Even in the cross sectional view, hatching may not be given for the sake of simple illustration, whereas hatching may be given even in the plan view.

A preferred embodiment of the present invention will now specifically be made based on the accompanying drawings.
(Semiconductor Device Compared and Examined by Present Inventors)

Specific descriptions will be made to problems and subjects in the semiconductor device based on the comparison and examination performed by the present inventors, because it is considered to clarify the semiconductor device and its manufacturing method, according to the embodiment.

Comparative Example 1

Figure 30:
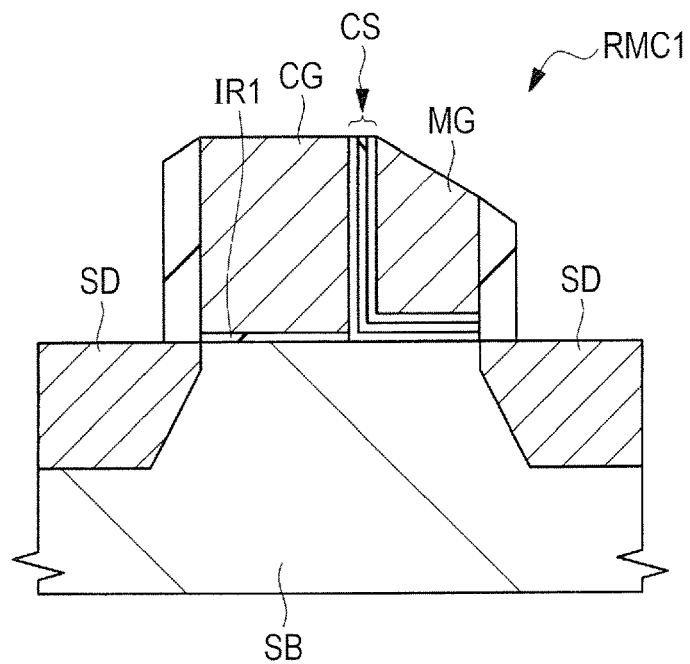
FIG. 30 is a cross sectional view showing a memory cell according to a comparative example 1.

FIG. 30 is a cross sectional view showing, in a gate longitudinal direction, a split gate-type memory cell having a planar channel of a comparative example 1. In the illustration, a symbol CG represents a control gate electrode, a symbol CS represents an insulating film including a charge accumulation film, a symbol IR1 represents a gate insulating film, a symbol MG represents a memory gate electrode, a symbol SB represents a semiconductor substrate, and a symbol SD represents source/drain regions.

There is formed the gate insulating film IR1 which is formed from silicon oxide or silicon oxynitride between the control gate electrode CG and the semiconductor substrate SB of a memory cell RMC1.

As the generation progresses, the thickness of the gate insulating film IR1 is equal to or lower than 3 nm, and the gate length of the control gate electrode CG is equal to or lower than 100 nm. In this case, it is necessary to increase the impurity concentration of the semiconductor substrate SB, because the threshold voltage of the control gate electrode CG is increased. However, if the impurity concentration of the semiconductor substrate SB is increased, there are some remarkable phenomena, such as disturbance (a phenomenon of a variation in accumulated charges, due to a voltage applied to each node, at the time of rewriting/reading of the memory cell), a variation in the threshold voltage of the control gate electrode CG, and deterioration of the driving force.

Comparative Example 2

Figure 31:
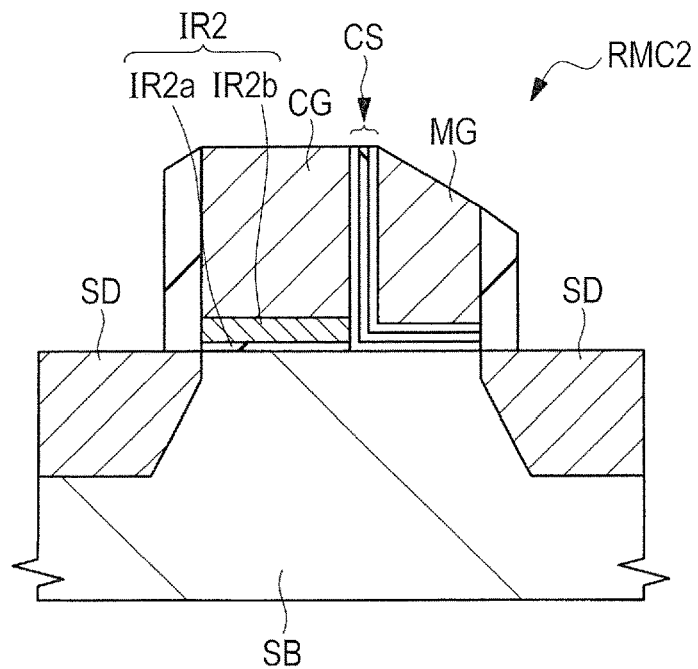
FIG. 31 is a cross sectional view showing a memory cell according to a comparative example 2.

FIG. 31 is a cross sectional view (see Japanese Unexamined Patent Application Publication No. 2008-41832), in a gate longitudinal direction, showing a split gate-type memory cell having a planar channel of the comparative example 2. In the illustration, a symbol CG represents a control gate electrode, a symbol CS represents an insulating film including a charge accumulation film, a symbol IR2 represents a gate insulating film, a symbol IR2a represents an insulating film, a symbol IR2b represents a metal element-containing layer, a symbol MG represents a memory gate electrode, a symbol SB represents a semiconductor substrate, and a symbol SD represents source/drain regions.

The gate insulating film IR2 is formed between the control gate electrode CG and the semiconductor substrate SB of a memory cell RMC2. The gate insulating film IR2 is formed from a laminated film of the insulating film IR2a and the metal element-containing layer IR2b. The film IR2a is formed from silicon oxide or silicon oxynitride. The layer IR2b is formed from metal oxide or metal silicate. It is possible to control the threshold voltage of the control gate electrode CG, using Fermi-level pinning occurred at the junction surface of the metal element-containing layer IR2b and a polycrystalline silicon film included in the control gate electrode CG.

In this case, the threshold voltage of the control gate electrode CG can be increased, without increasing the impurity concentration of the semiconductor substrate SB. Thus, it is possible to prevent disturbance, a variation in the threshold voltage of the control gate electrode CG, and deterioration of the driving force.

However, there are some problems, such that (1) it is difficult to control the thickness of the metal element-containing layer IR2b, (2) the range of the controllable threshold voltage is narrow, and (3) the metal element-containing layer IR2b traps charges at the time of writing and erasing, thus undesirably causing a characteristic deterioration of the selection transistor.

Comparative Example 3

Figure 32A:
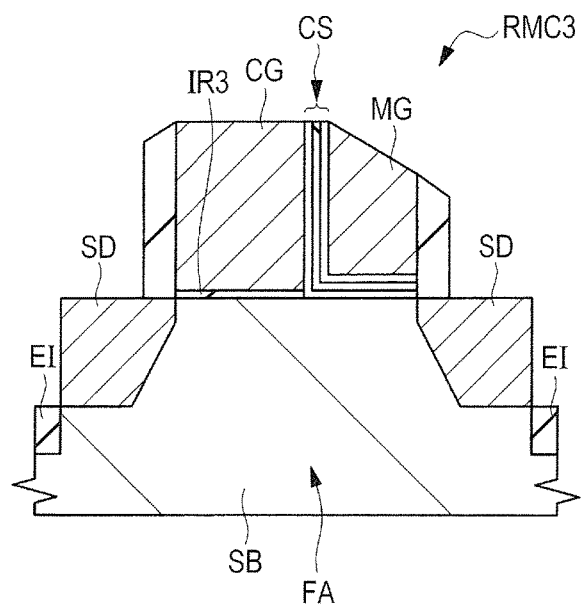
FIG. 32A is a cross sectional view showing a gate longitudinal direction of the memory cell according to the comparative example 3.
Figure 32B:
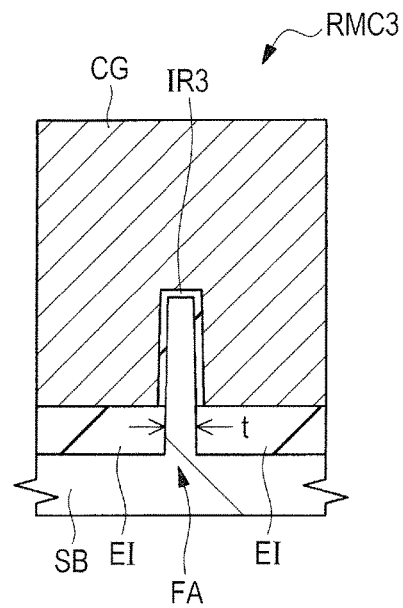
FIG. 32B is across sectional view showing a gate widthwise direction thereof.

FIG. 32A is a cross sectional view showing, in a gate longitudinal direction, a split gate-type memory cell having a fin channel of the comparative example 3, and FIG. 32B is a cross sectional view showing the memory cell in a gate widthwise direction. In the illustration, a symbol CG represents a control gate electrode, a symbol CS represents an insulating film including a charge accumulation film, a symbol EI represents an element isolation region, a symbol FA represents a fin, a symbol IR3 represents a gate insulating film, a symbol MG represents a memory gate electrode, a symbol SB represents a semiconductor substrate, and a symbol SD represents source/drain regions.

A memory cell RMC3 having a fin-type channel can perform a perfect depletion type operation, and has the following advantages that: the S value is low; there is only a small variation of the threshold voltages of the control gate electrode CG due to an impurity fluctuation; and the driving force is high.

The threshold value (Vth) is expressed by Equation (1).

$$Vth = Vfb + 2\phi f + Qb/Cox \qquad \text{Equation (1)}$$

In this case, Vfb represents a flat band voltage, ϕf represents a depletion layer potential, Qb represents an amount of fixed charges in the depletion layer, and Cox represents a gate capacity.

The amount of fixed charges (Qb) in the depletion layer is expressed by Equation (2).

$$Qb = q*Na*ts \qquad \text{Equation (2)}$$

In this case, q represents the amount of electron charges, Na represents the acceptor concentration, and ts represents the width of the depletion layer.

In the case of the fin channel, because the width ts of the depletion layer depends on the width t of the fin FA, a problem is that the threshold voltage decreases, if the width t of the fin FA is reduced. As a countermeasure for this problem, it is considered to increase the impurity concentration of the fin FA. However, the resistance of the channel is increased, and the mobility decreases. This results in lowering the driving force and losing the effect of the fin channel.

Preferred Embodiment

<Structure of Semiconductor Device>

A semiconductor device according to a preferred embodiment includes a split gate-type memory cell having a fin-type channel. This memory cell is formed of a selection transistor and a memory transistor which share the source and the drain regions.

Figure 2:
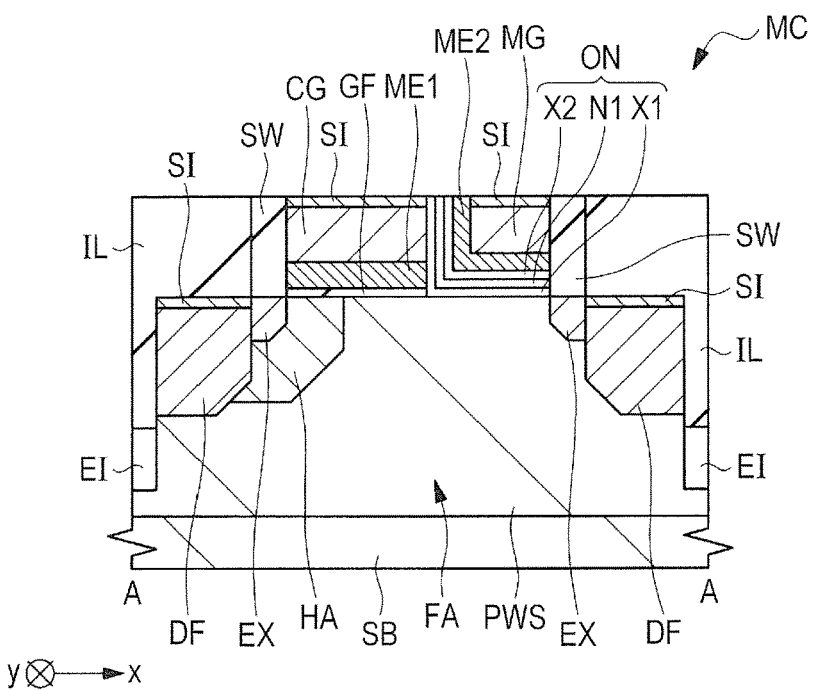
FIG. 2 is a cross sectional view taken along a line A-A of FIG. 1.
Figure 3:
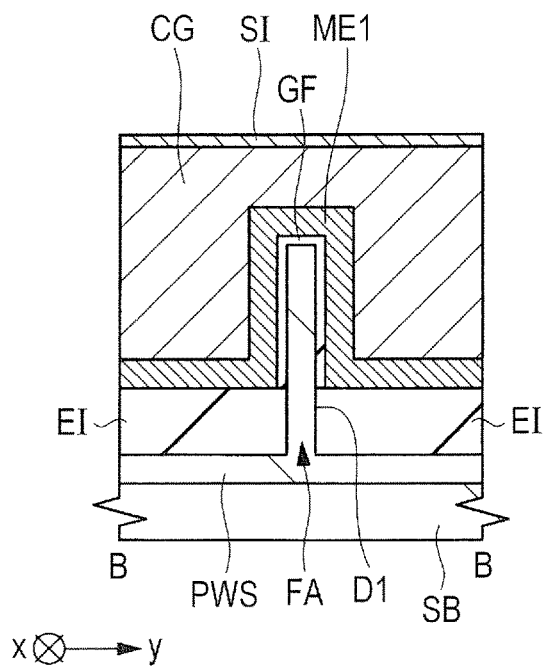
FIG. 3 is a cross sectional view taken along a line B-B of FIG. 1.
Figure 4:
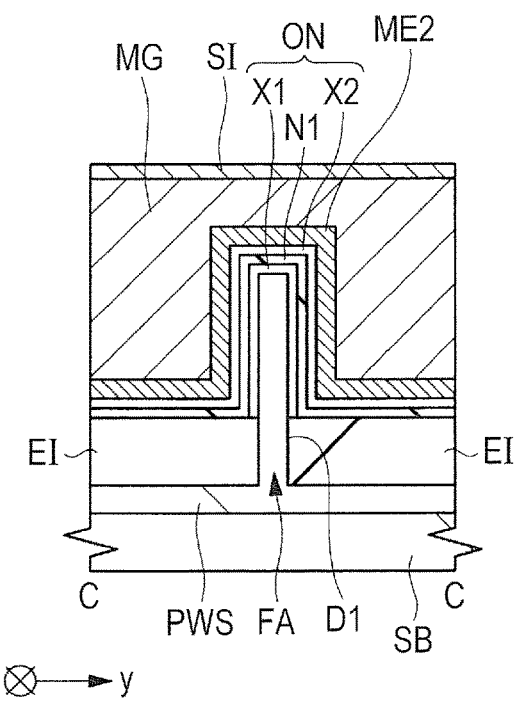
FIG. 4 is a cross sectional view taken along a line C-C of FIG. 1.

Descriptions will now be made to the structure of the semiconductor device according to the preferred embodiment, using FIG. 1 to FIG. 4. FIG. 1 is a plan view showing a memory cell region of the semiconductor device according to the embodiment. FIG. 2 is a cross sectional view taken along a line A-A of FIG. 1. FIG. 3 is a cross sectional view taken along a line B-B of FIG. 1. FIG. 4 is a cross sectional view taken along a line C-C of FIG. 1.

The cross section taken along the line A-A illustrated in FIG. 2 is the cross section along an extending direction of the fin. The cross section taken along the line B-B illustrated in FIG. 3 is the cross section along an extending direction of the control gate electrode over the fin. The cross section taken along the line C-C illustrated in FIG. 4 is the cross section along an extending direction of the memory gate electrode over the fin. FIG. 1 does not illustrate the source/drain regions, the interlayer insulating film, and the silicide layer over the gate electrode.

As illustrated in FIG. 1 to FIG. 4, a memory cell (non-volatile memory cell) MC is a part of the semiconductor substrate SB, and formed over the plate fin FA formed on the upper part of the semiconductor substrate SB.

The fin FA is a pattern of a semiconductor layer extending along an x direction along the main surface of the semiconductor substrate SB. The width of the fin FA in a y direction along the main surface of the semiconductor substrate SB and orthogonal to the x direction is remarkably smaller than the width of the fin FA in the x direction. The semiconductor substrate SB is formed from, for example, single crystal silicon.

The fin FA includes a plurality of fins which are mutually separately arranged in the y direction. In FIG. 1, only three fins FA in the y direction are illustrated. However, more than three fins FA may be arranged in the y direction.

The plurality of fins FA may be arranged in the x direction as well, and as long as projection parts have the length, width, and height, they are formed in whatever shape. For example, there is included a meandering pattern in plan view. The fins FA may be arranged in whatever form.

A ditch D1 is formed on the side of the main surface of the semiconductor substrate SB, between the fins FA. An element isolation region EI is an insulating film to be buried in the ditch D1, and is formed from, for example, silicon oxide. However, the element isolation region EI is not fully buried into the ditch D1. Thus, a part of the fin FA projects from the upper surface of the element isolation region EI. The height of the fin FA exposed from the upper surface of the element isolation region EI is, for example, approximately 40 nm to 100 nm.

In this embodiment, the plate semiconductor layer is called a fin FA. The semiconductor layer includes an upper layer pattern and a lower layer pattern. The upper layer pattern is included in one part of the semiconductor substrate SB, exposed from the element isolation region EI, and extends in the x direction. The lower layer pattern reaches from the upper layer pattern up to the bottom of the ditch D1, right below the upper layer pattern.

That is, the fin FA is a semiconductor pattern projecting upward the semiconductor substrate SB on the side of the main surface of the semiconductor substrate SB, and is a projection unit extending in the x direction. In the fin FA, a p-type well PWS including p-type impurities (for example, boron (B)) is formed deeper than in the source/drain regions, as will be described later.

As illustrated in FIG. 1 to FIG. 4, right above the fins FA arranged in the y direction, there are formed a control gate electrode CG extending in the y direction of the selection transistor and a memory gate electrode MG extending in the y direction of the memory transistor, across the fins FA.

The control gate electrode CG is formed through a gate insulating film GF on the upper surface and the sidewall of the fin FA exposed from the upper surface of the element isolation region EI. The gate insulating film GF is formed, for example, from silicon oxide, while the control gate electrode CG is formed from polycrystalline silicon to which, for example, n-type impurities are introduced.

Further, there is formed a first metal film ME1 between the gate insulating film GF and the control gate electrode CG. The selection transistor has a gate structure which is formed from the gate insulating film GF, the first metal film ME1, and the control gate electrode CG including the n-type polycrystalline silicon. The first metal film ME1 is formed, for example, from titanium nitride (TiN). It is considered that the thickness of the first metal film ME1 is preferably in a range from, for example, 5 nm to 50 nm (needless to say, it is not limited to this range, in any other conditions). The range from 5 nm to 7 nm is most preferred.

The work function (a first work function) of the first metal film ME1 is relatively high, and particularly equal to or greater than, for example, the intrinsic Fermi level (4.6 eV) of silicon (Si). This enables to increase the threshold voltage of the selection transistor (enhancement type). The effect of the gate structure of the selection transistor having the first metal film ME1 provided therein will specifically be described later in <Features and Effects of Semiconductor Device>.

One side surface of the control gate electrode CG in the x direction is covered by a sidewall spacer SW. On the other side surface, the memory gate electrode MG is famed through an ONO film ON. The sidewall spacer SW is famed from, for example, silicon nitride, silicon oxide, or a laminated film thereof. The ONO film ON is a laminated film of a silicon oxide film X1, a silicon nitride film N1, and a silicon oxide film X2, sequentially in order from the side of the semiconductor substrate SB and the control gate electrode CG. The memory gate electrode MG is formed from polycrystalline silicon into which, for example, n-type impurities are introduced. The silicon nitride film N1 is a trap insulating film (a charge accumulation film, a charge storage film), and can change the threshold voltage of the memory cell MC, by changing the charge accumulation state of the silicon nitride film N1 in accordance with the operation of the memory cell MC.

The memory gate electrode MG is formed on the upper surface and the sidewall of the fin FA exposed from the upper surface of the element isolation region EI through the ONO film ON. That is, the ONO film ON has a L-shaped cross section which is continuously formed along the upper surface of the fin FA and the side surface of the of the control gate electrode CG.

Further, a second metal film ME2 is famed between the ONO film ON and the memory gate electrode MG. The memory transistor has a gate structure which is formed from the ONO film ON, the second metal film ME2, and the memory gate electrode MG formed from n-type polycrystalline silicon. The second metal film ME2 is formed of the same metal material (for example, titanium nitride (TiN)) as the first metal film ME1.

The thickness of the second metal film ME2 is thinner than that of the first metal film ME1, the work function (the second work function) of the second metal film ME2 is relatively low, for example, lower than the intrinsic Fermi level (4.6 eV) of silicon (Si). This enables to lower the threshold voltage of the memory transistor (deplete type). The effect of the gate structure of the memory transistor having the second metal film ME2 provided therein will specifically be described in <Features and Effects of Semiconductor Device>.

The side surface not in contact with the ONO film ON, as the side surface of the memory gate electrode MG in the x direction, is covered by the sidewall spacer SW. The memory gate electrode MG and the second metal film ME2 are insulated from the control gate electrode CG and the fin FA by the ONO film ON.

A silicide layer SI is formed on each upper surface of the control gate electrode CG and the memory gate electrode MG. The silicide layer SI is formed from, for example, nickel silicide (NiSi) or cobalt silicide (CoSi). The silicide layer SI is provided to reduce the coupling resistance between a contact plug (not illustrated) and the control gate electrode CG or the memory gate electrode MG. This contact plug is coupled to the upper surface of the control gate electrode CG and the upper surface of the memory gate electrode MG.

A pair of source/drain regions are formed in the fins FA on both sides of the pattern formed from the control gate electrode CG and the memory gate electrode MG in the x direction. The source/drain regions are formed of two n-type semiconductor regions, which are an extension region EX and a diffusion layer DF, into which n-type impurities (for example, phosphorus (P) or arsenic (As)) are introduced. The extension region EX is a region whose n-type impurity concentration is lower than that of the diffusion layer DF. In this case, the extension region EX is formed shallower than the diffusion layer DF. The extension layer EX is arranged in a position nearer right below the control gate electrode CG and the memory gate electrode MG than the adjacent diffusion layer DF.

In this manner, the source/drain regions have an LDD (Lightly Doped Drain) structure including the extension region EX having a low impurity concentration and the diffusion layer DF having the high impurity concentration.

A halo region HA into which p-type impurities are introduced is formed to surround the extension region EX in a position on the side of the control gate electrode CG. It is possible to suppress that the depletion layer of the extension region EX spreads into the channel direction, by providing the halo region HA.

The control gate electrode CG and the pair of source/drain regions formed in the fin FA are to form the selection transistor having a MISFET (Metal Insulator Semiconductor Field Effect Transistor) structure. The memory gate electrode MG and the pair of source/drain regions formed in the fin FA are to form the memory transistor having the MISFET structure.

One memory cell MC according to this embodiment is an electrically rewritable non-volatile memory cell which enables to perform a writing operation and an erasing operation. The memory cell MC is formed of the selection transistor and the memory transistor, mutually sharing the source/drain regions. That is, the memory cell MC has the control gate electrode CG, the memory gate electrode MG, the ONO film ON, the drain region in the vicinity of the control gate electrode CG, and the source region in the vicinity of the memory gate electrode MG. Further, the fin FA right below the control gate electrode CG and the memory gate electrode MG includes a channel region in which a channel is formed at the time of operating the memory cell MC, and this channel is a fin-type channel.

As illustrated in FIG. 2 to FIG. 4, the upper surface of the element isolation region EI, the upper surface and the sidewall of the fin FA, and the sidewall of the sidewall spacer SW are covered by the interlayer insulating film IL. The interlayer insulating film IL is formed from, for example, silicon oxide. Though not illustrated, a thin insulating film is formed between the interlayer insulating film IL, the upper surface of the element isolation region EI, the upper surface and the sidewall of the fin FA, and the sidewall of the sidewall spacer SW. This insulating film is formed from, for example, silicon nitride. The upper surfaces of the respective interlayer insulating film IL, the sidewall spacer SW, the ONO film ON, the control gate electrode CG, and the memory gate electrode MG are planarized approximately in same plan view.

Though not illustrated, the upper parts of the respective interlayer insulating film IL and the memory cell MC are covered by an interlayer insulating film. Though not illustrated, there are formed a plurality of contact plugs penetrating through the interlayer insulating film IL and the interlayer insulating film over the interlayer insulating film IL. The contact plugs are electrically coupled to the control gate electrode CG, the memory gate electrode MG, and the source/drain regions. Though not illustrated, wiring is famed over the contact plugs.

<Features and Effects of Semiconductor Device>

Descriptions will hereinafter be specifically made to the main features of the semiconductor device according to this embodiment.

Figure 5A:
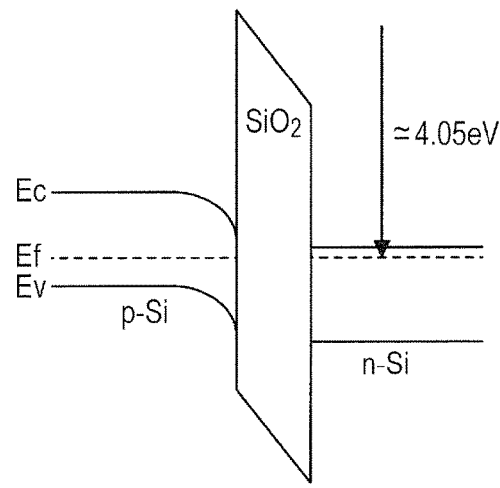
FIG. 5A is a band diagram of a gate structure of a selection transistor according to a comparative example 3.
Figure 5B:
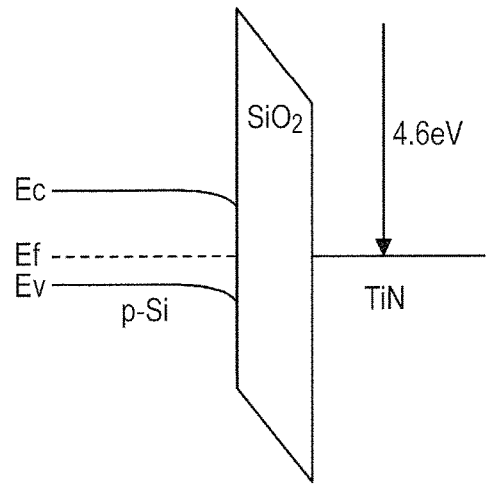
FIG. 5B is a band diagram of a gate structure of a selection transistor according to an embodiment.

FIG. 5A is a band diagram of a gate structure of the selection transistor according to the comparative example 3, and FIG. 5B is a band diagram of a gate structure of the selection transistor according to this embodiment.

FIG. 5A is a band diagram illustrating the gate structure of the comparative example 3, which is formed from a semiconductor substrate formed from p-type single crystal silicon (Si), a silicon oxide ($SiO_2$) film, and n-type polycrystalline silicon (Si). FIG. 5B is a band diagram illustrating the gate structure of this embodiment, which is formed from a semiconductor substrate formed from p-type single crystal silicon (Si), a silicon oxide ($SiO_2$) film, a metal film, and an n-type polycrystalline silicon (Si) film (not illustrated). The metal film is a titanium nitride (TiN) film, and its thickness is approximately, for example, 5 nm.

As illustrated in FIG. 5A, in the comparative example 3, the work function of the n-type polycrystalline silicon film is close to 4.05 eV, as the band level of the conduction band. As illustrated in FIG. 5B, in this embodiment, the work function of the titanium nitride film is 4.6 eV, substantially the same as the intrinsic Fermi level of silicon. In this case, bending of silicon included in the semiconductor substrate is reduced. Thus, no inversion layer is formed, unless a voltage greater than that of the comparative example 3 is applied. As a result, it is possible to raise the threshold voltage of the selection transistor according to this embodiment than the threshold voltage of the selection transistor according to the comparative example 3, for example, by 0.5 V.

Figure 6:
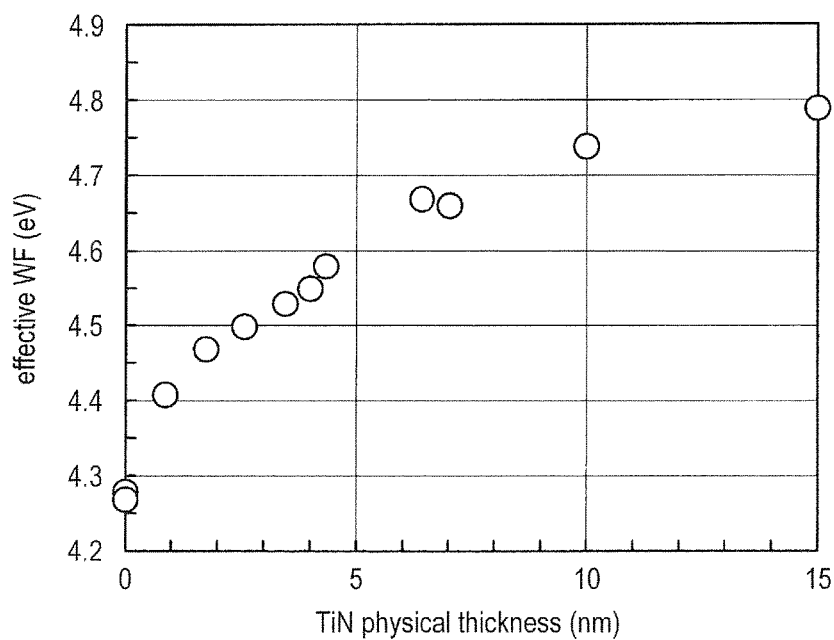
FIG. 6 is a graph diagram illustrating the relationship between the work function and the thickness of a titanium nitride film.

FIG. 6 is a graph diagram showing the relationship between the work function and a thickness of a titanium nitride film.

As illustrated in FIG. 6, the work function of the titanium nitride film depends on the film thickness. Thus, it is possible to control the work function of the titanium nitride film by changing the thickness of the titanium nitride film, and it is also possible to obtain the word function in a range from the valance band of silicon over the conduction band. For example, to an extent that the thickness of the titanium nitride film is 5 nm, the work function of the titanium nitride film is approximately 4.6 eV. That is, it is possible to obtain a desired threshold voltage of the selection transistor, by controlling the thickness of the titanium nitride film.

In the fin-type channel, the width of the depletion layer depends on the width of the fin. In this case, a problem is that the threshold voltage decreases, if the width of the fin is small. However, if the metal film is formed, and the work function on the side of the control gate electrode is controlled, the threshold voltage can be increased, without increasing the impurity concentration of the fin. Thus, it is possible to maintain as the features and effects of the fin-type channel. The features and effects are: that the S value is low; there is only a small variation of the threshold voltages of the control gate electrode due to an impurity fluctuation; and the driving force is high.

In the comparative example 2, the threshold voltage of the selection transistor is controlled by using a metal oxide film layer. In the case of the metal oxide film layer, because the film thickness of equal to or lower than 1 atomic layer is necessary, a problem exists in the film thickness controllability. In this embodiment, however, the threshold voltage of the selection transistor is controlled by using the metal film. For example, in the case of the titanium nitride film, the film thickness of approximately 5 nm to 50 nm may be controlled, thereby obtaining stable film thickness controllability.

The descriptions have so far been made to the gate structure of the selection transistor. The same applies to the gate structure of a memory transistor. It is possible to obtain a desired threshold voltage of the memory transistor without changing the impurity concentration of the fin, by forming the metal film and controlling the work function on the side of the memory gate electrode.

In the selection transistor, switching of ON/OFF is necessary, and the threshold voltage needs to be enhanced, in order to control the memory operation. That is, the selection transistor is preferably of the enhancement type. On the other hand, in the memory transistor, the threshold value needs to be lowered, when wiring is performed with an SSI system, as will be described later. That is, the memory transistor is preferably of the deplete type.

As described above, the work function of the titanium nitride film depends on the film thickness (see FIG. 6). Thus, in the memory cell MC illustrated in FIG. 2, when the selection transistor is of the enhancement type, while the memory transistor is of the deplete type, in the selection transistor, the first metal film ME1 is formed using, for example, a titanium nitride film whose work function is equal to or greater than 4.6 eV. Further, in the memory transistor, the second metal film ME2 is formed using, for example, a titanium nitride film whose work function is lower than 4.6 eV. As a result, without changing the impurity concentration of the fin, it is possible to set a high threshold voltage in the selection transistor, while it is possible to set a low threshold voltage in the memory transistor.

In this embodiment, the memory cell MC is an n-channel type MISFET, the control gate electrode CG and the memory gate electrode MG are formed of n-type polycrystalline silicon. Thus, the first metal film ME1 on the side of the control gate electrode CG is formed using a relatively thick titanium nitride film whose work function is equal to or greater than, for example, 4.6 eV. In addition, the second metal film ME2 on the side of the memory gate electrode MG is formed using a relatively thin titanium nitride film whose work function is lower than, for example, 4.6 eV.

However, when the memory cell MC is a p-channel type MISFET in which the control gate electrode CG and the memory gate electrode MG are formed of a p-type polycrystalline silicon film, a different combination from the above-described combination is applicable. That is, the first metal film ME1 on the side of the control gate electrode CG is formed using a relatively thin titanium nitride film whose work function is equal to or lower than, for example, 4.6 eV. In addition, the second metal film ME2 on the side of the memory gate electrode MG is formed using a relatively thick titanium nitride film whose work function is greater than, for example 4.6 eV. In this case, it is considered that the thickness of the first metal film ME1 is preferably in a range, for example, from 1 nm to 5 nm (needless to say, it is not limited to this range, in any other conditions).

<Operation of Semiconductor Device>

Descriptions will now be made mainly to operations of a non-volatile memory cell, in the semiconductor device according to this embodiment.

The memory cell according to this embodiment has a MISFET structure, assumes a charge accumulation state of a trap insulating film in the gate electrode of the MISFET as storage information, and reads the information as a threshold value of the MISFET. The trap insulating film indicates an insulating film capable of accumulating charges. A silicon nitride film can be given as an example of the trap insulating film. The threshold value of the MISFET is shifted by injecting/discharging charges to the charge accumulation region, and it is operated as a storage element. Like the memory cell according to this embodiment, a split gate type MONOS (Metal-Oxide-Nitride-Oxide-Semiconductor) memory is one non-volatile semiconductor memory unit using the trap insulating film.

Operational methods for writing and erasing for the memory cell include, for example, an SSI (Source Side Injection) system, a BTBT (Band To Band Tunneling) system, and an FN (Fowler Nordheim) system.

The SSI system can be assumed as an operational method for writing for the memory cell by injecting hot electrons to the trap insulating film. The BTBT system can be assumed as an operational method for erasing for the memory cell by injecting hot holes to the trap insulating film. The FN system can be assumed as an operational method for writing or erasing by tunneling electrons or holes. In the FN system, specifically namely, writing with the FN system, can be assumed as an operational method for writing for the memory cell by injecting electrons into the trap insulating film by the FN tunneling effect. In addition, erasing with the FN system can be assumed as an operational method for erasing the memory cell into the trap insulating film by injecting holes by the FN tunneling effect.

Descriptions will now be made to the cases in which the writing is performed in accordance with the SSI system, and the erasing is performed in accordance with the FN system, with reference to FIG. 2. That is, "writing" is defined as injection of electrons into the trap insulating film (for example, the silicon nitride film N1 as a charge accumulation unit in the ONO film ON illustrated in FIG. 2), and "erasing" is defined as injection of holes thereinto.

In the writing with the SSI system, the writing is performed by applying a writing operation voltage to each unit of the selection memory cell for performing the writing, and injecting hot electrons into the trap insulating film of the selection memory cell.

At this time, the hot electrons are generated in a channel region (between the source and the drain) below between two gate electrodes (the memory gate electrode and the control gate electrode), and the hot electrons are injected into the trap insulating film below the memory gate electrode. The injected hot electrons are captured in the trap level in the trap insulating film. As a result, the threshold voltage of the selection memory cell is increased. That is, the selection memory cell is in a writing state.

In the erasing with the FN system, an erasing operation voltage is applied to each unit of the selection memory cell for performing the erasing. Further, in the selection memory cell, the erasing is performed by tunneling the holes from the memory gate electrode and injecting the holes into the trap insulating film. At this time, the holes are injected into the trap insulating film through FN tunneling (FN tunneling effect), from the memory gate electrode. Then, the holes are captured in the trap level in the trap insulating film. As a result, the threshold voltage of the selection memory cell is decreased. That is, the selection memory cell is in an erasing state.

At the time of performing reading, a reading operation voltage is applied to each unit of the selection memory cell for performing the reading. It is possible to discriminate the writing state and the erasing state, by setting the voltage to be applied to the memory gate electrode at the time of reading to a value between the threshold voltage in the writing state and the threshold voltage in the erasing state.

<Manufacturing Method of Semiconductor Device>

Descriptions will now be made to the manufacturing method for the semiconductor device according to this embodiment, using FIG. 7 to FIG. 23. FIG. 7 to FIG. 23 are cross sectional views for explaining a manufacturing process for the semiconductor device according to this embodiment.

FIG. 7 to FIG. 23 illustrate cross sectional views taken along a line A-A of a memory cell region 1A illustrated in FIG. 1, cross sectional views taken along a line B-B, cross sectional views taken along a line C-C, cross sectional views along a gate length direction and cross sectional views along a gate width direction of an n-channel type MIS transistor with a low withstand voltage, having the MISFET structure formed in a logic region 1B.

Figure 7:
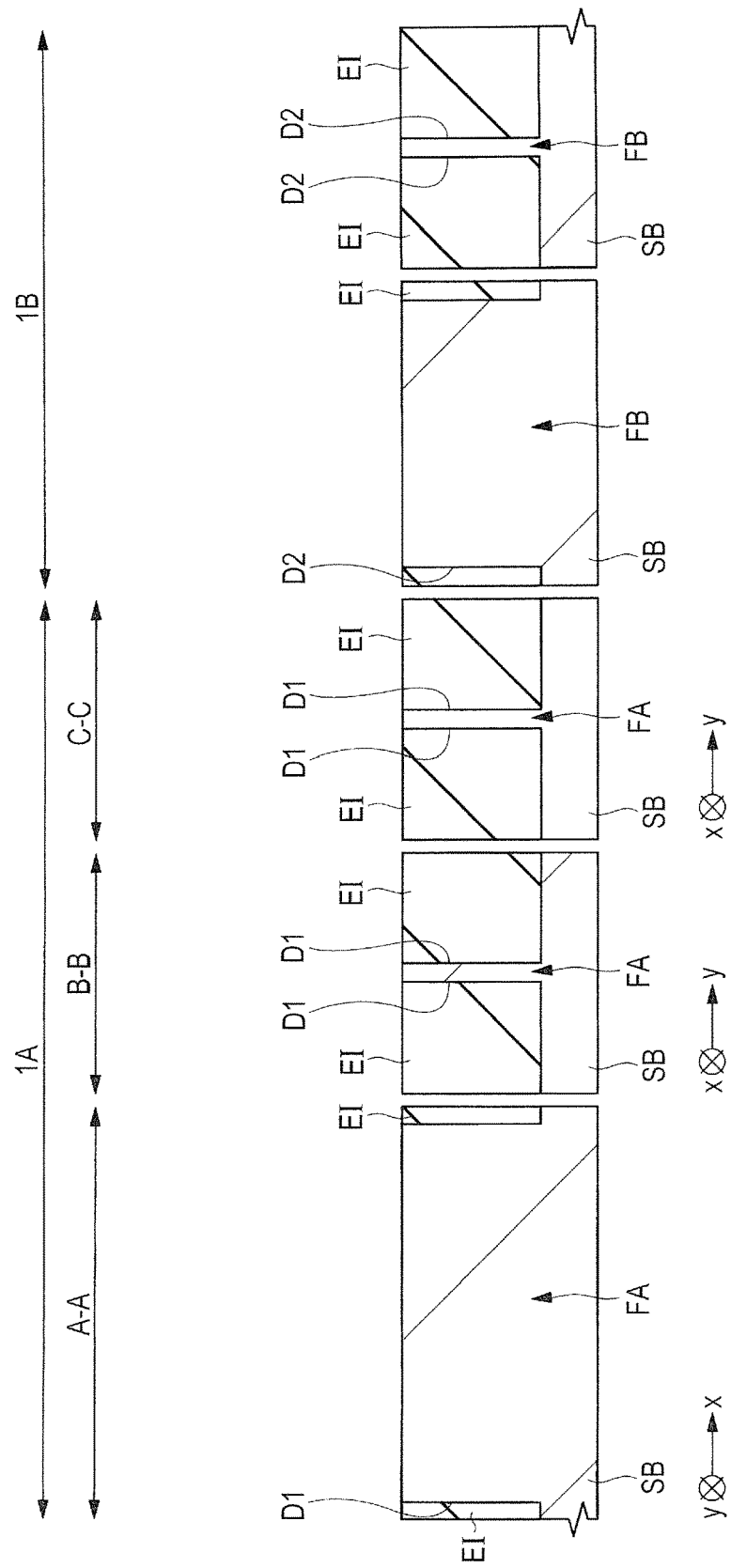
FIG. 7 is a cross sectional view for explaining a manufacturing process for a semiconductor device (a memory cell region and a logic region) according to the embodiment.

First, as illustrated in FIG. 7, a semiconductor substrate SB is prepared. Subsequently, there are formed fins FA and ditches D1 around the fins FA. The fins FA are formed from a part including the main surface of the semiconductor substrate SB in the memory cell region 1A. There are formed fins FB and ditches D2 around the fins FB. The fins FB are formed from a part including the main surface of the semiconductor substrate SB in the logic region 1B. The depth of each of the ditches D1 and D2 is, for example, approximately 120 nm to 250 nm. That is, there are formed the plate fins FA and FB projecting upward the semiconductor substrate SB on the side of the main surface of the semiconductor substrate SB. The width in a y direction of the fins FA in the memory cell region 1A is approximately, for example, 20 nm to 50 nm, while the width in the y direction of the element isolation region EI is, for example, 90 nm.

An insulating film is buried in each of the ditches D1 and D2 using, for example, a CVD (Chemical Mechanical Deposition) technique. This insulating film is formed from, for example, silicon oxide. After this, this insulating film is polished using, for example, a CMP (Chemical Mechanical Polishing) technique. As a result, the upper surface of the insulating film in the memory cell region 1A and the logic region 1B is planarized, to form the element isolation region EI buried in each of the ditches D1 and D2.

Figure 8:
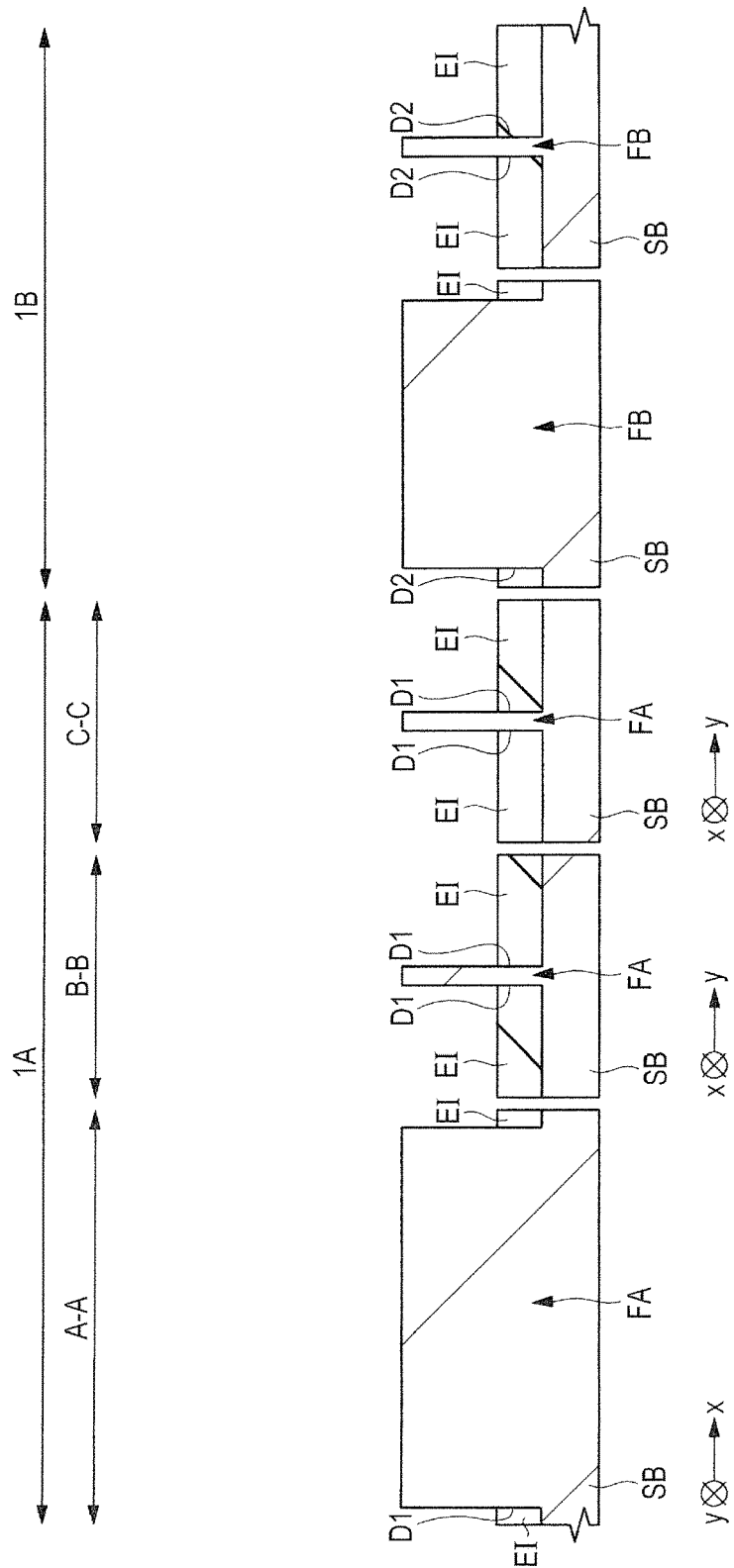
FIG. 8 is a cross sectional view for explaining a manufacturing process for the semiconductor device, following that of FIG. 7.

As illustrated in FIG. 8, the upper surface of the element isolation region EI is retreated using isotropic dry etching, thereby exposing the sidewall of each of the fins FA and FB extending in the x direction from the element isolation region EI. The height of the fins FA and FB exposed from the upper surface of the element isolation region EI is approximately, for example, 40 nm to 60 nm. The isotropic dry etching for the upper surface of the element isolation region EI may be performed separately for the memory cell region 1A and the logic region 1B. In this case, the etching is performed in a state where a region not to be etched is covered by the resist pattern.

Figure 9:
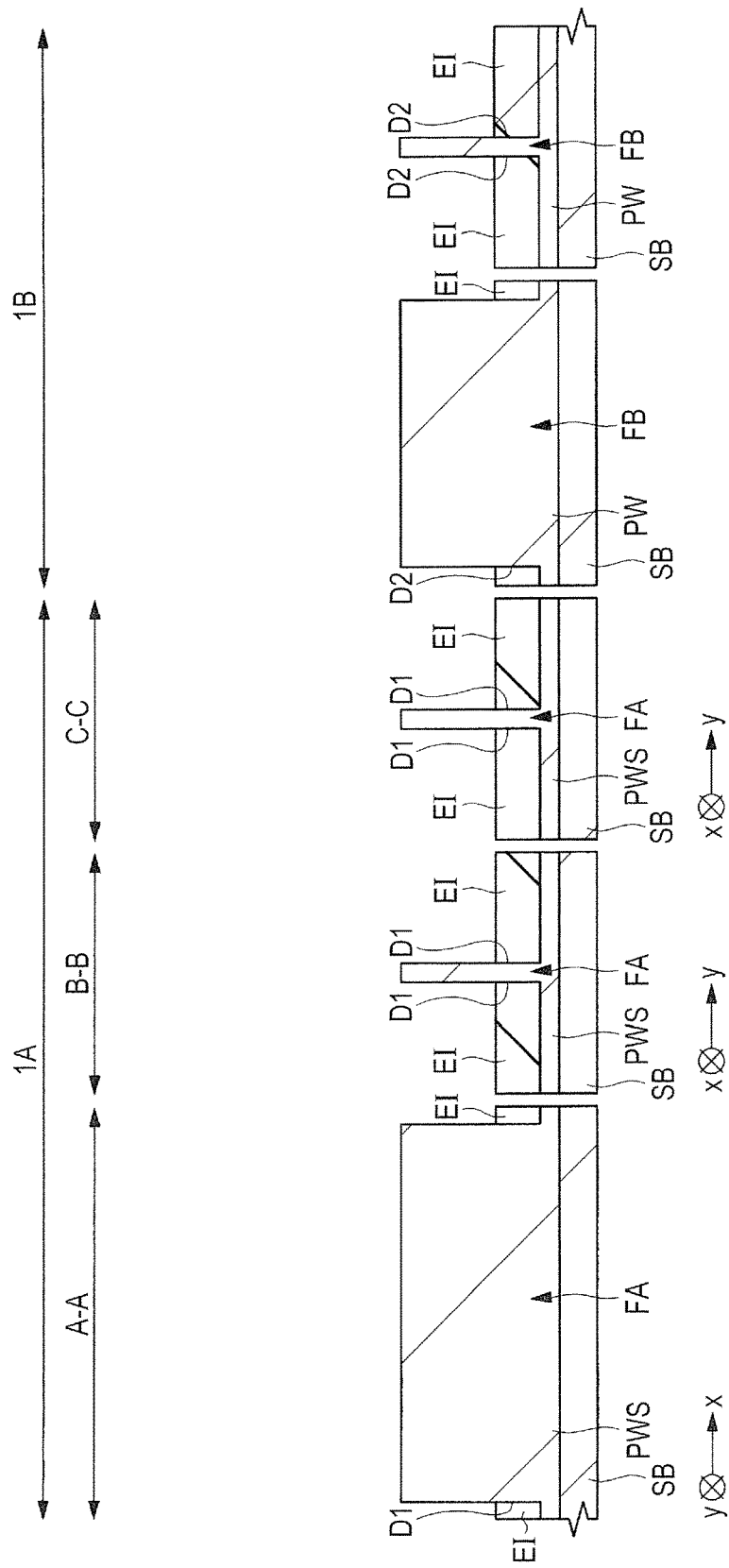
FIG. 9 is a cross sectional view for explaining a manufacturing process for the semiconductor device, following that of FIG. 8.

As illustrated in FIG. 9, p-type impurities (for example, boron (B)) are implanted onto the semiconductor substrate SB including the fin FA of the memory cell region 1A and the fin FB of the logic region 1B. As a result, a p-type well PWS is formed in the memory cell region 1A, and a p-type well PW is formed in the logic region 1B.

Figure 10:
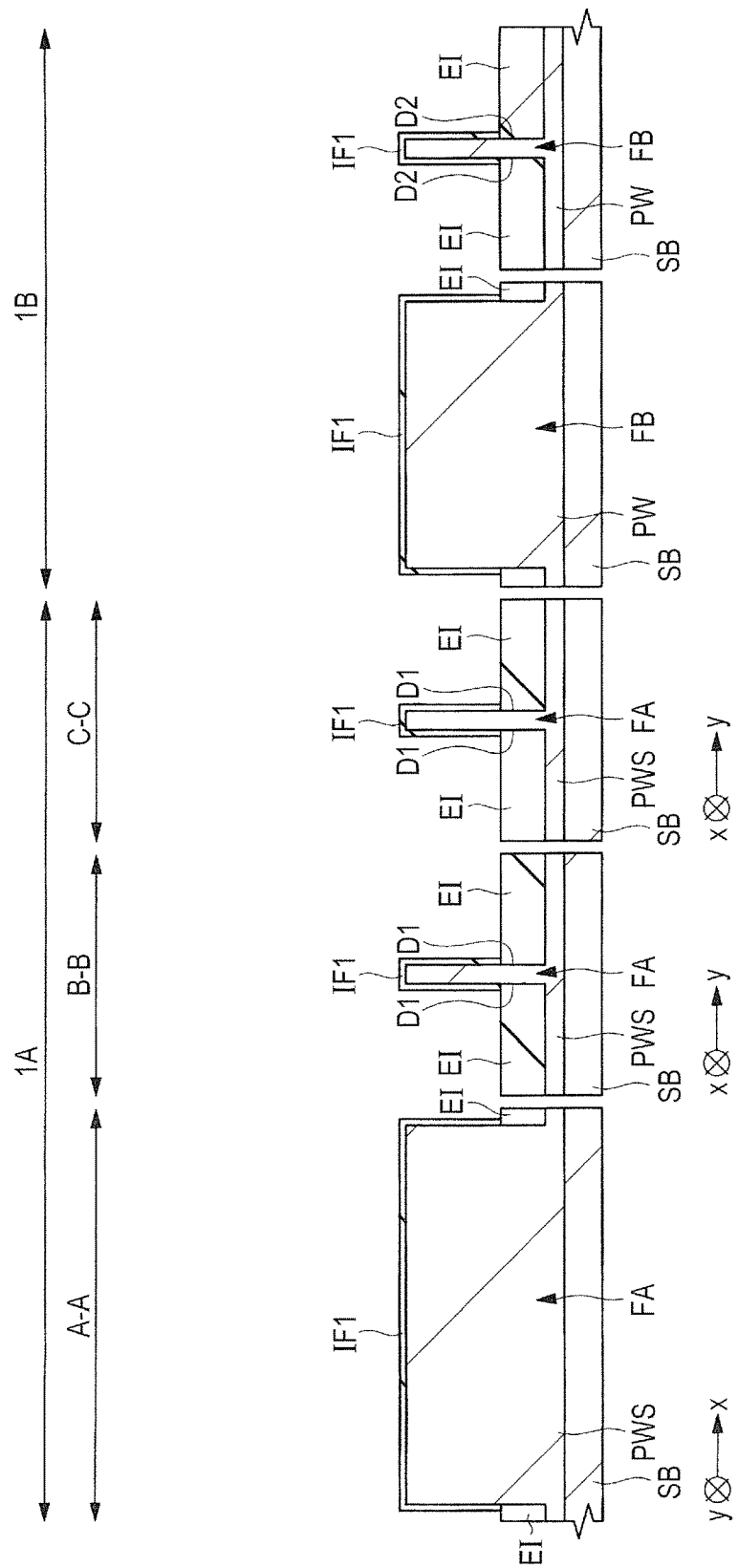
FIG. 10 is a cross sectional view for explaining a manufacturing process for the semiconductor device, following that of FIG. 9.

As illustrated in FIG. 10, there is famed an insulating film IF1 covering the upper surface and the sidewall of each of the exposed fins FA and FB from the upper surface of the element isolation region EI. The insulating film IF1 can be formed using, for example, a thermal oxidation method, and is formed from, for example, silicon oxide. The insulating film IF1 covers the upper surface and the sidewall of the fins FA and FB, and the upper surface of the element isolation region EI is exposed from the insulating film IF1. The thickness of the insulating film IF1 is approximately, for example, 1 nm to 2 nm.

Figure 11:
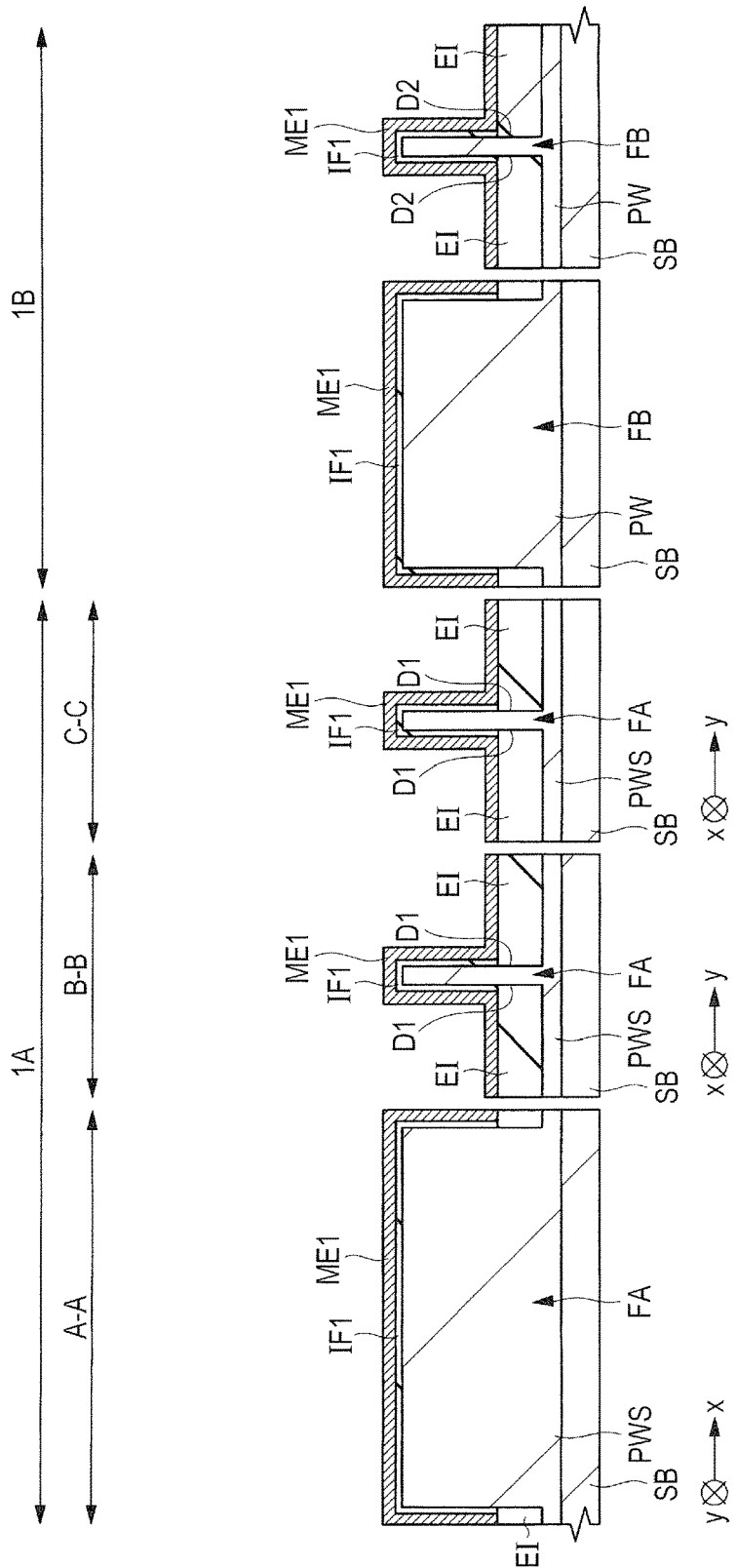
FIG. 11 is a cross sectional view for explaining a manufacturing process for the semiconductor device, following that of FIG. 10.

As illustrated in FIG. 11, for example, the first metal film ME1 is formed over the element isolation region EI and the insulating film IF1. The first metal film ME1 is, for example, a titanium nitride film, and its thickness is approximately, for example, 5 nm to 50 nm.

Figure 12:
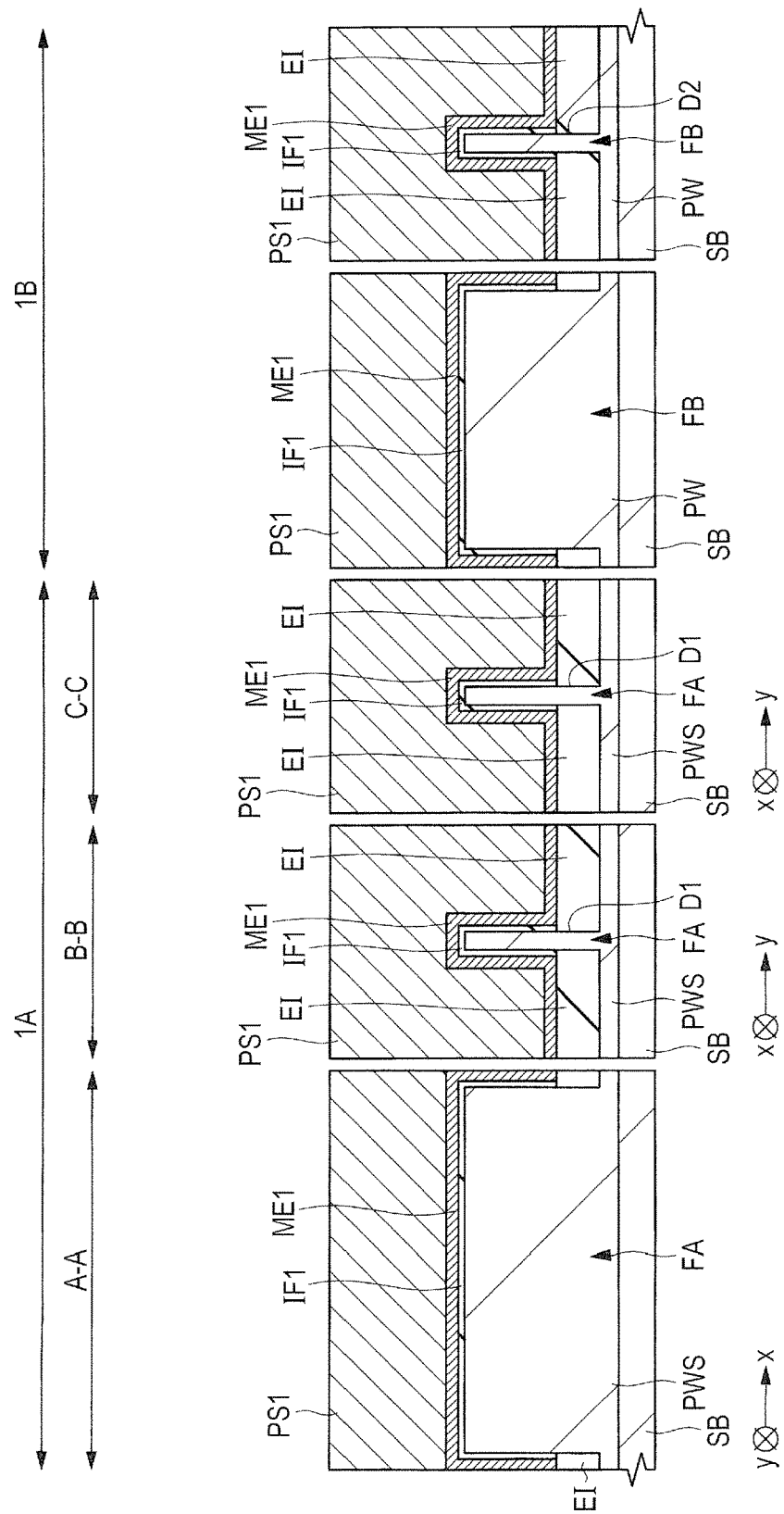
FIG. 12 is a cross sectional view for explaining a manufacturing process for the semiconductor device, following that of FIG. 11.

As illustrated in FIG. 12, after a polycrystalline silicon film PS1 is formed using, for example, the CVD technique over the first metal film ME1, the upper surface of the polycrystalline silicon film PS1 is polished using the CMP technique. The thickness of the polycrystalline silicon film PS1, from the upper surface of the fins FA and FB up to the upper surface of the polycrystalline silicon film PS1, is approximately, for example, 60 nm to 150 nm.

Figure 13:
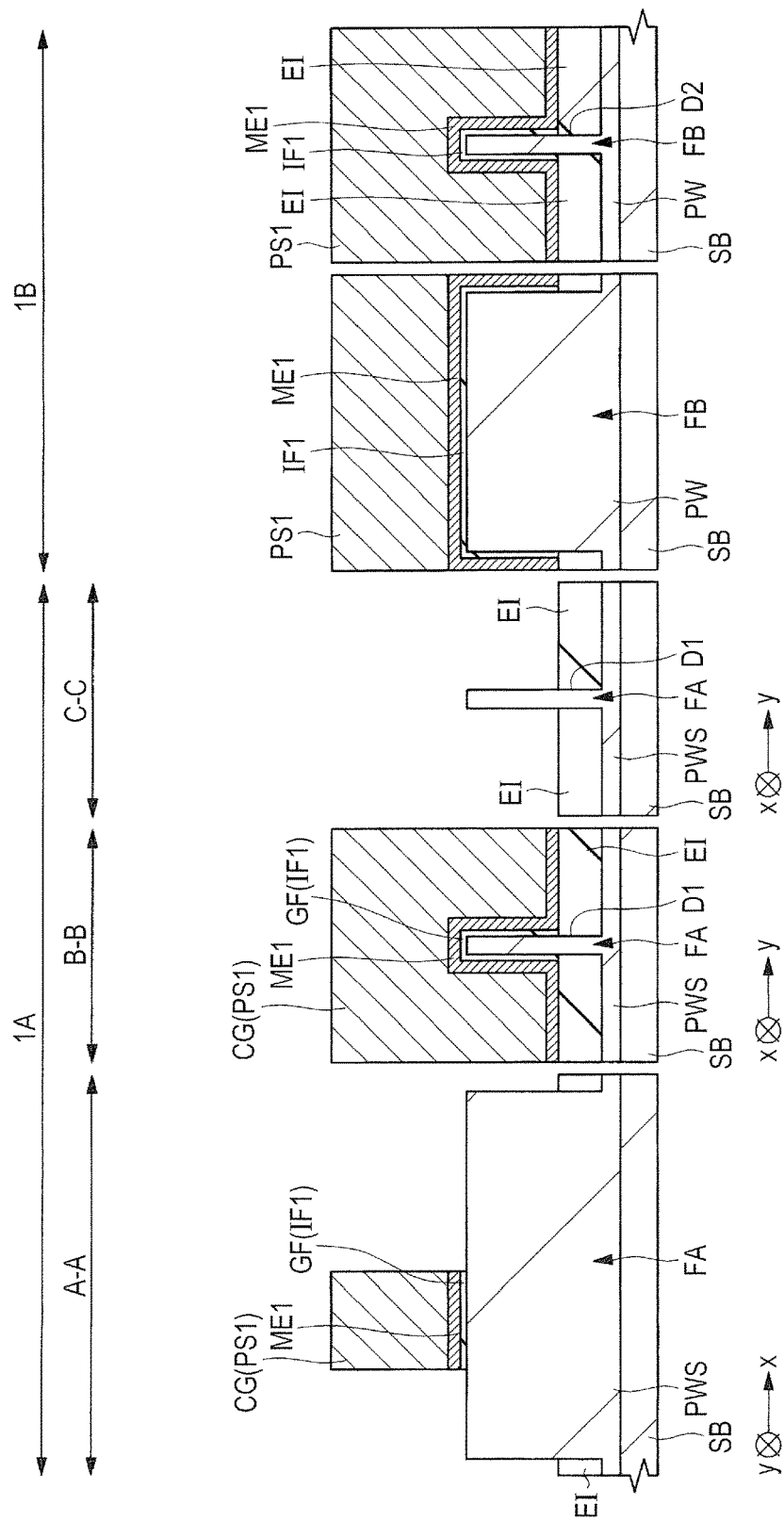
FIG. 13 is a cross sectional view for explaining a manufacturing process for the semiconductor device, following that of FIG. 12.

As illustrated in FIG. 13, the polycrystalline silicon film PS1, the first metal film ME1, and the insulating film IF1 of the memory cell region 1A are processed by performing the dry etching, with using a resist pattern (not illustrated) as a mask. At this time, the patterning is performed in a state where the logic region 1B is covered by the resist pattern. As a result, there is formed a laminated pattern which is formed from the polycrystalline silicon film PS1, the first metal film ME1, and the insulating film IF1, right over the fin FA. By this patterning, there is formed the control gate electrode CG formed from the polycrystalline silicon film PS1, and there is formed the gate insulating film GF formed from the insulating film IF1. After this, the resist pattern is removed.

The laminated pattern formed from the first metal film ME1 and the control gate electrode CG extends in the y direction, and is arranged across the upper part of the fins FA through the gate insulating film GF (see FIG. 1). In the memory cell region LA, in any region other than a part in which the laminated pattern is famed, the polycrystalline silicon film PS1, the first metal film ME1, and the insulating film IF1 of the memory cell region LA are removed by the dry etching. As a result of this dry etching, the upper surface and the sidewall of the fins FA and the upper surface of the element isolation region EI are exposed.

Figure 14:
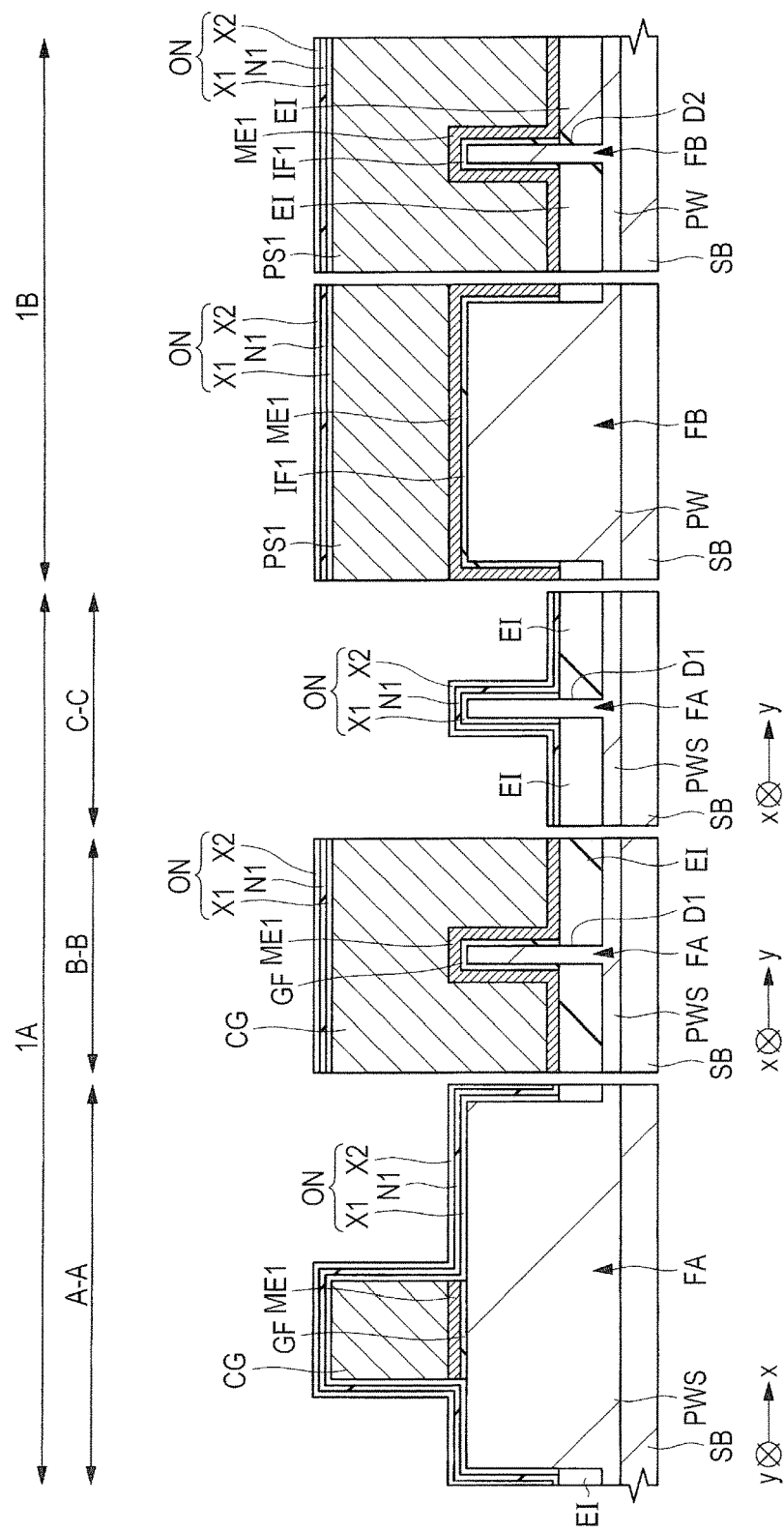
FIG. 14 is a cross sectional view for explaining a manufacturing process for the semiconductor device, following that of FIG. 13.

As illustrated in FIG. 14, oxidation is performed for the exposed upper surface and the sidewall of the fins FA and the upper surface and the sidewall of the control gate electrode CG, using a thermal oxidation method. This results in forming a silicon oxide film (bottom oxide film) X1 covering the exposed upper surface and side surface of the fins FA and the upper surface and side surface of the control gate electrode CG. FIG. 14 illustrates the silicon oxide film X1 which is continuously formed from the upper surface of the fins FA over the side surface of the control gate electrode CG. However, there is no need to form the silicon oxide film X1 on the side surface of the gate insulating film GF.

Next, a silicon nitride film N1 is formed over the silicon oxide film X1 and the element isolation region EI, using, for example, a CVD technique. The silicon nitride film N1 functions as a trap insulating film for accumulating charges in a memory cell to be formed later. The descriptions have been made to the case where the silicon nitride film N1 is formed as the trap insulating film. However, it is not limited to the silicon nitride film N1 as the trap insulating film, and an insulating film formed from, for example, hafnium silicate (HfSiO). Subsequently, a silicon oxide film (a top oxide film) X2 is formed over the silicon nitride film N1, using, for example, the CVD technique.

The ONO film ON is configured with a laminated film of the silicon oxide film X1, the silicon nitride film N1, and the silicon oxide film X2, which are laminated sequentially from the side of the semiconductor substrate SB. The ONO film ON in contact with the side surface of the control gate electrode CG is formed from the silicon oxide film X1, the silicon nitride film N1, and the silicon oxide film X2, which are formed in the x direction sequentially from the side of the control gate electrode CG. In this case, the material of the top oxide film of the uppermost layer of the ONO film ON is not limited to silicon oxide, and may be, for example, alumina ($Al_2O_3$).

The ONO film ON implies a laminated film which is substantially formed from the silicon oxide film X1, the silicon nitride film N1, and the silicon oxide film X2. For the convenience of explanation, the ONO film ON may also imply a laminated film which is formed from the silicon nitride film N1 and the silicon oxide film X2.

Figure 15:
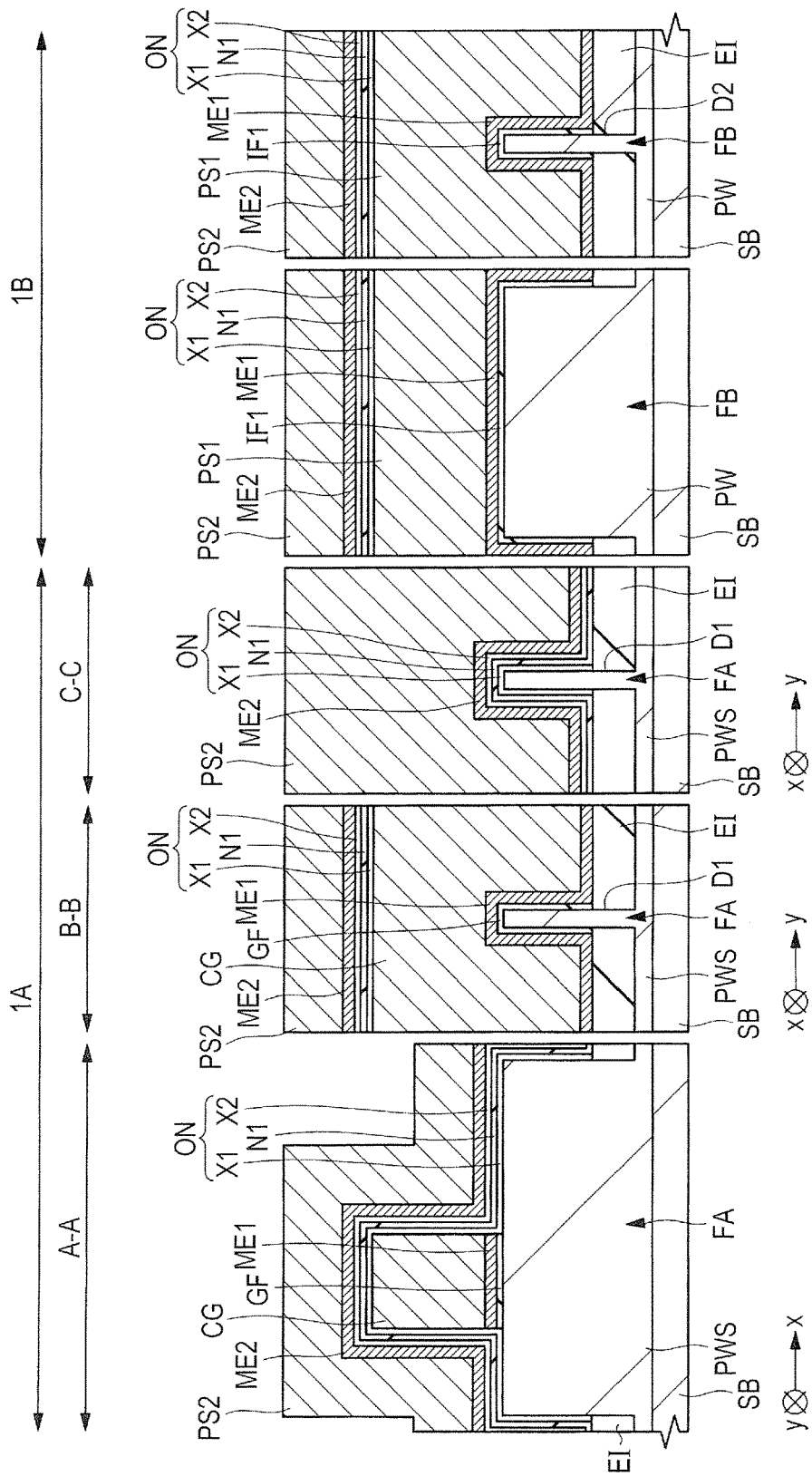
FIG. 15 is a cross sectional view for explaining a manufacturing process for the semiconductor device, following that of FIG. 14.

As illustrated in FIG. 15, for example, the second metal film ME2 is formed over the ONO film ON. The second metal film ME2 is, for example, a titanium nitride film, and its thickness is approximately, for example, 2 nm.

Then, a polycrystalline silicon film PS2 is formed over the second metal film ME2, using, for example, a CVD technique. The thickness of the polycrystalline silicon film PS2 is equal to or greater than at least the thickness of the control gate electrode CG. In this case, the polycrystalline silicon film PS2 formed of a film having a greater thickness than the thickness of the control gate electrode CG, thereby covering the laminated film including the control gate electrode CG, the ONO film ON, and the second metal film ME2.

Figure 16:
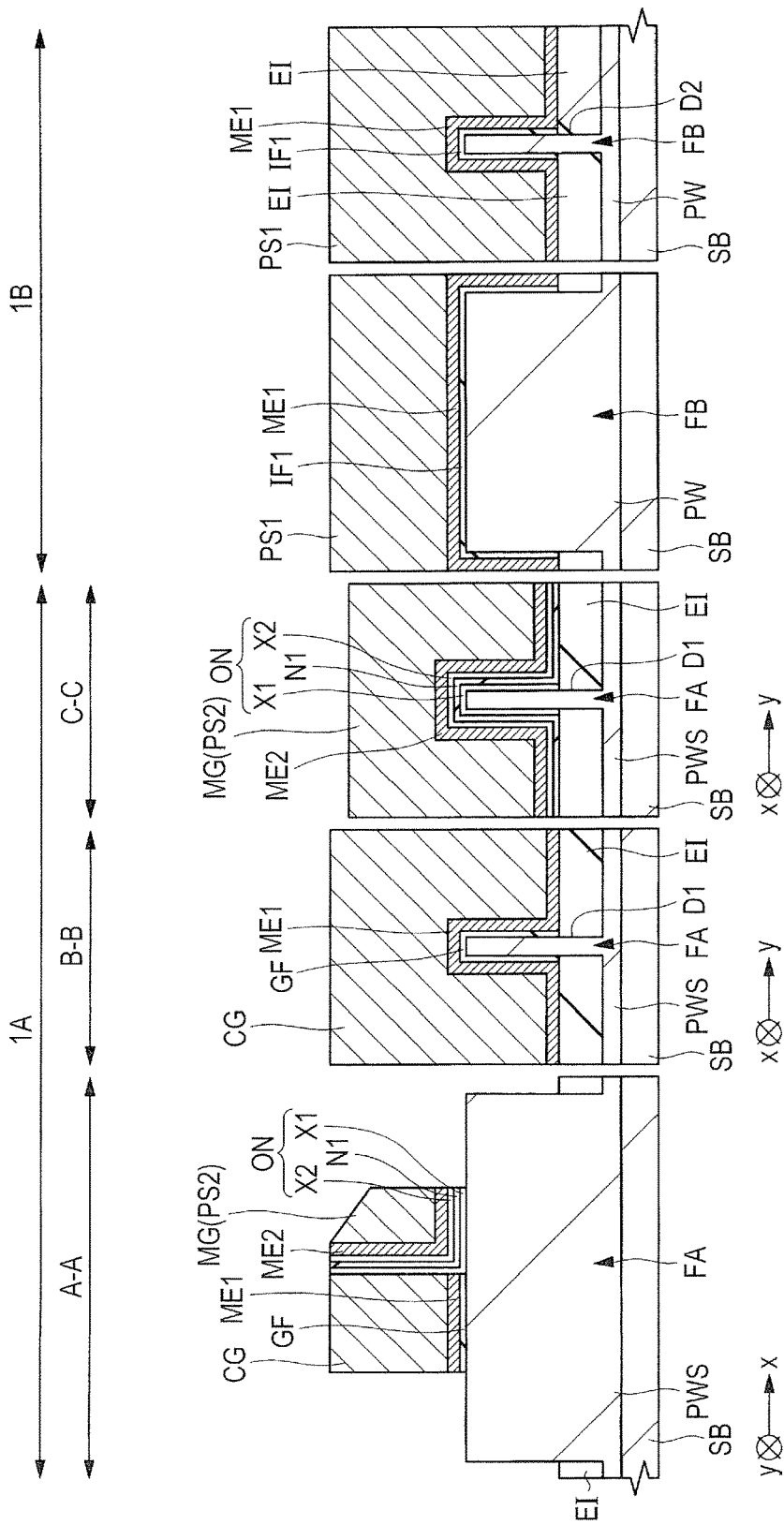
FIG. 16 is a cross sectional view for explaining a manufacturing process for the semiconductor device, following that of FIG. 15.

As illustrated in FIG. 16, the polycrystalline silicon film PS2 is processed by performing dry etching. As a result, the memory gate electrode MG formed from the polycrystalline silicon film PS2 is formed on both sides of the control gate electrode CG, through the ONO film ON and the second metal film ME2. Note that the memory gate electrode MG adjacent to one side surface of the control gate electrode CG is a pattern to be removed in a following process, and does not remain in the semiconductor device after completed. The second metal film ME2 is exposed in (on) the upper surface and the sidewall of the fins FA on which the control gate electrode CG and the memory gate electrode MG are not formed and the upper surface of the element isolation region EI.

The memory gate electrode MG adjacent to one side surface of the control gate electrode CG is removed by the dry etching with using the resist pattern as a mask. As a result, the memory gate electrode MG adjacent to the other side surface of the control gate electrode CG remains. Subsequently, the exposed second metal film ME2 is removed, and further the ONO film ON is removed. In this case, the metal film ME2 is one that is removed from both sides of the pattern formed from the control gate electrode CG and the memory gate electrode MG and the upper surface of the control gate electrode CG.

That is, the ONO film ON and the second metal film ME2 remain between the memory gate electrode MG and the fin FA and also between the memory gate electrode MG and the control gate electrode CG. Thus, in the memory cell region 1A, in the regions on both sides of the pattern formed from the control gate electrode CG and the memory gate electrode MG, the upper surface and the sidewall of the control gate electrode CG and the upper surface of the element isolation region EI are exposed. In the logic region 1B, the upper surface of the polycrystalline silicon film PS1 is exposed. Subsequently, in a following process for injecting impurities for the fin FA, an oxidation process may be performed for the upper surface and the sidewall of the fin FA, for the purpose of preventing that the fin FA is damaged.

As a result, on the upper surface and the sidewall of the fin FA, there is formed a pattern having the control gate electrode CG and the memory gate electrode MG adjacent to the control gate electrode CG through the ONO film ON and the second metal film ME2. The ONO film ON and the second metal film ME2 extending along the upper surface of the fin FA (that is, along the main surface of the semiconductor substrate SB) are continuously formed, and also the ONO film ON and the second metal film ME2 extending along the side surface of the control gate electrode CG are continuously formed, and they are formed in L-shaped cross section.

Figure 17:
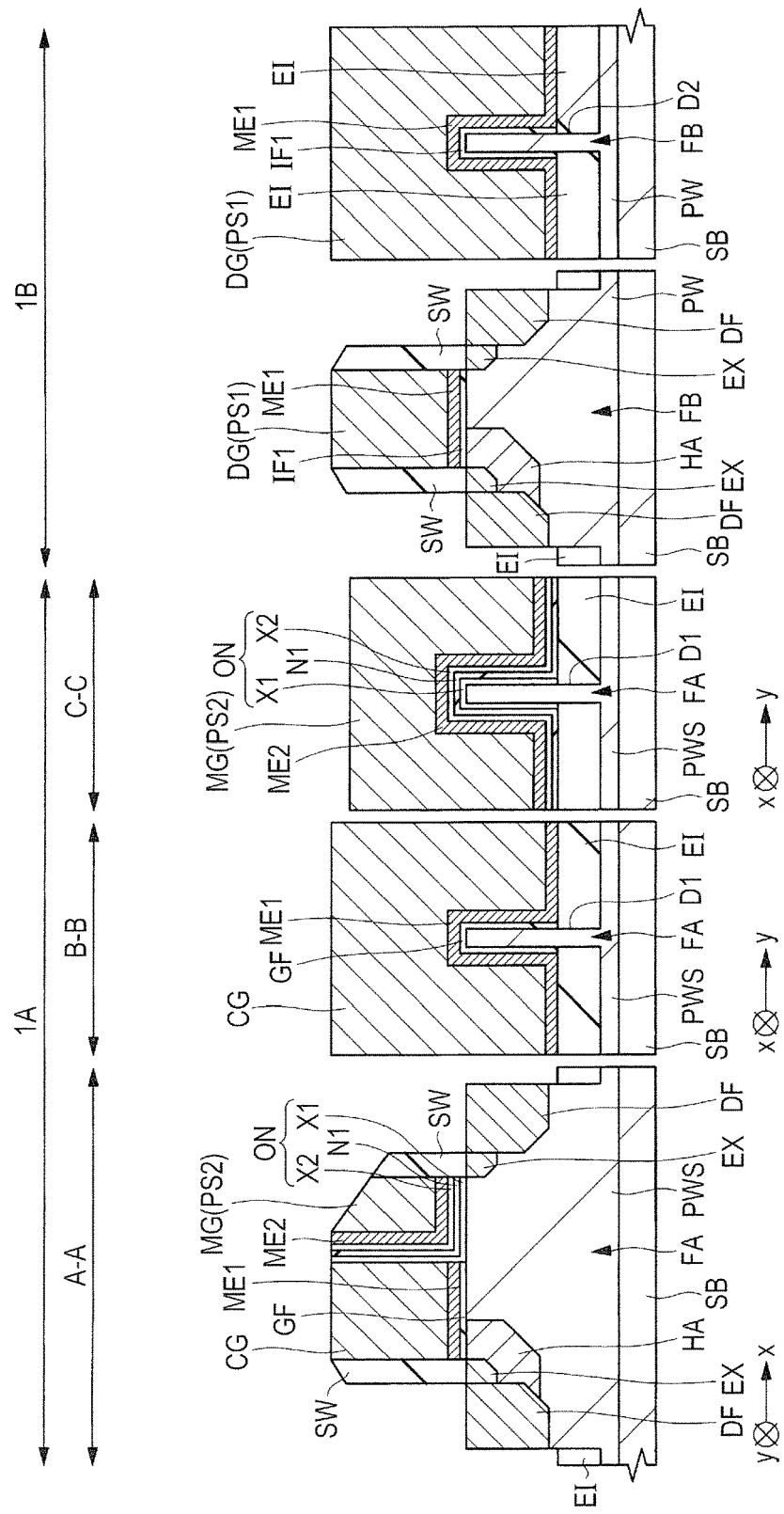
FIG. 17 is a cross sectional view for explaining a manufacturing process for the semiconductor device, following that of FIG. 16.

As illustrated in FIG. 17, after forming the resist pattern (not illustrated) covering the memory cell region 1A and exposing a part of the logic region 1B, the polycrystalline silicon film PS1 of the logic region 1B is processed by the dry etching with using the resist pattern as a mask. As a result, a dummy gate electrode DG formed from the polycrystalline silicon film PS1 is formed right over the fin FB. In the regions on both sides of the dummy gate electrode DG, the upper surface and the sidewall of the fin FB and the upper surface of the element isolation region EI are exposed. That is, on the upper surface and the sidewall of the fin FB, there is formed the dummy gate electrode DG through the insulating film IF1 and the first metal film ME1. The dummy gate DG is a pseudo gate electrode which is removed in a following process, and does not remain in the completed semiconductor device. After this, this resist pattern is removed.

N-type impurities (for example, phosphorus (P) or arsenic (As)) are implanted onto the upper surface of the fins FA and FB. This results in forming an extension region EX as an n-type semiconductor region whose impurity concentration is relatively low. The extension region EX of the memory cell region 1A is formed on the fin FA on both sides of the pattern which is formed from the control gate electrode CG and the memory gate electrode MG. The extension region EX of the logic region 1B is formed on the fin FB on both sides of the dummy gate electrode DG. Further, p-type impurities (for example, boron (B)) are implanted onto the fins FA and FB, to form a halo region HA.

An insulating film is formed over the semiconductor substrate SB, using, for example, the CVD technique. This insulating film is formed from, for example, silicon oxide and silicon nitride, or a laminated film thereof. Subsequently, the upper surface and the sidewall of the fins FA and FB are exposed from the insulating film, by the dry etching. As a result, in the memory cell region 1A, a sidewall spacer SW formed from this insulating film is formed on the side surface of both sides of the pattern which is formed from the control gate electrode CG and the memory gate electrode MG. In the logic region 1B, the sidewall spacer SW formed from this insulating film is formed on the side surface of both sides of the dummy gate electrode DG.

N-type impurities (for example, phosphorus (P) or arsenic (As)) are implanted onto the upper surface of the fins FA and FB. As a result, there is formed a diffusion layer DF as an n-type semiconductor region whose impurity concentration is relatively high. The diffusion layer DF of the memory cell region 1A is formed on the fin FA on both sides of the pattern which is formed from the control gate electrode CG and the memory gate electrode MG. The diffusion layer DF of the logic region 1B is formed on the fin FB on both sides of the dummy gate electrode DG.

The diffusion layer DF is famed in a position further than the control gate electrode CG, the memory gate electrode MG, or the dummy gate electrode DG in the x direction, as compared with the extension region EX in contact with the diffusion layer DF. The formation depth of the diffusion layer DF is greater than the extension region EX, while the n-type impurity concentration thereof is greater than that. The extension region EX and the diffusion layer DF in contact with each other are to form the source/drain regions of the transistor. After this, a thermal process is performed as needed, to activate the impurities of the extension region EX and the diffusion layer DF.

In this case, the descriptions have been made to the case where the source/drain regions of the memory cell region 1A and the logic region 1B are formed in the same process. However, in the memory cell region 1A forming the memory cell with a withstand voltage higher than that of the transistor formed in the logic region 1B, it is considered that the impurity concentration of the source/drain regions is greater than the impurity concentration of the source/drain regions of the logic region 1B. Thus, it is possible to separately perform the process for forming the extension region EX and the diffusion layer DF of the memory cell region 1A and the process for forming the extension region EX and the diffusion layer DF of the logic region 1B. The descriptions have been made to the case where the source/drain regions are formed by ion injection. However, instead of the ion injection, it is possible to form an epitaxial layer having impurities introduced therein on the upper surface and the sidewall of the fins FA and FB on both sides of each of the gate electrodes, using an epitaxial growth technique.

Figure 18:
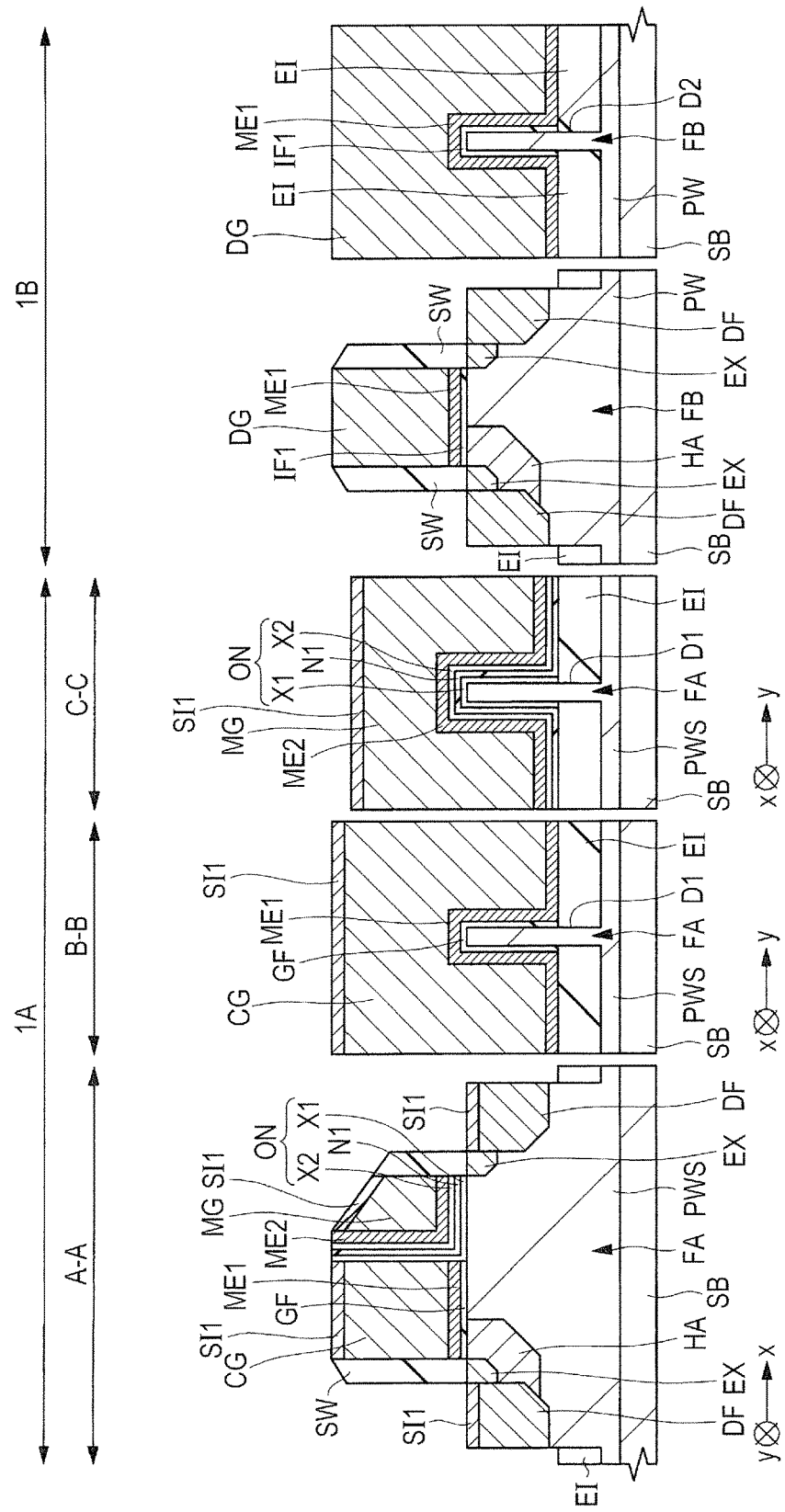
FIG. 18 is a cross sectional view for explaining a manufacturing process for the semiconductor device, following that of FIG. 17.

As illustrated in FIG. 18, a metal film formed from nickel (Ni) or cobalt (Co) is formed over the semiconductor substrate SB, using, for example, a sputtering technique. After this, a thermal process is performed, to cause reaction between the metal film and the upper surface of each of the control gate electrode CG and the memory gate electrode MG and between the metal film and the upper surface of each of the diffusion layer DF included in the source/drain regions of the memory cell region 1A.

As a result, there is formed a silicide layer SI1 which is formed from nickel silicide (NiSi) or cobalt silicide (CoSi), and which covers the upper surface of each of the control gate electrode CG and the memory gate electrode MG and the upper surface of the diffusion layer DF included in the source/drain regions of the memory cell region 1A. Subsequently, the unreacted metal film is dry etched and removed.

Figure 19:
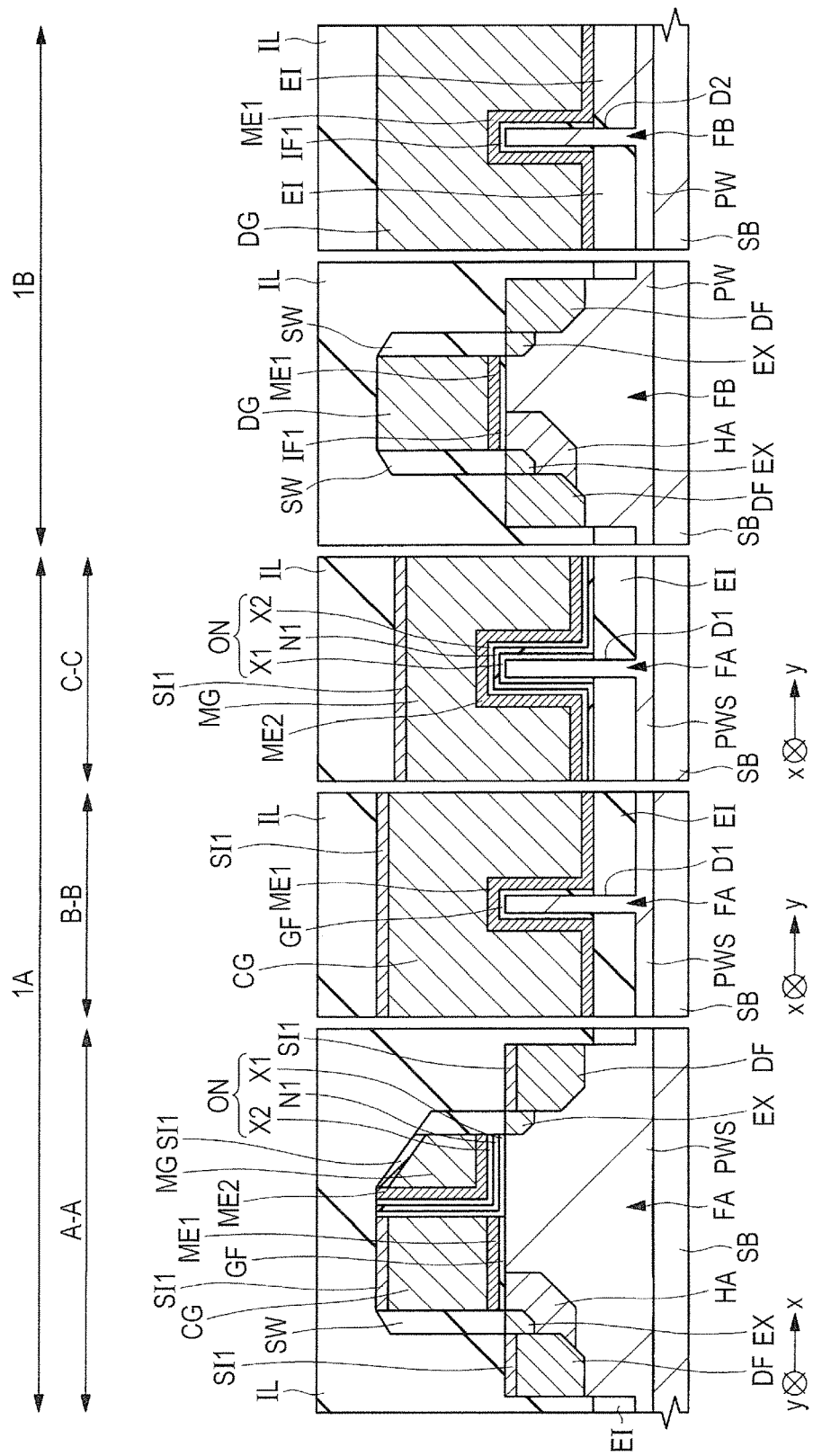
FIG. 19 is a cross sectional view for explaining a manufacturing process for the semiconductor device, following that of FIG. 18.

As illustrated in FIG. 19, there are sequentially famed an insulating film (not illustrated) formed from silicon nitride having a thickness of approximately 5 nm to 20 nm and the interlayer insulating film IL formed from, for example, silicon oxide, using, for example, a CVD technique, over the semiconductor substrate SB. The interlayer insulating film IL has a thickness greater than that of at least the control gate electrode CG. In this case, the thickness is greater than a thickness of a laminated film which is formed from the gate insulating film GF, the first metal film ME1, and the control gate electrode CG.

Figure 20:
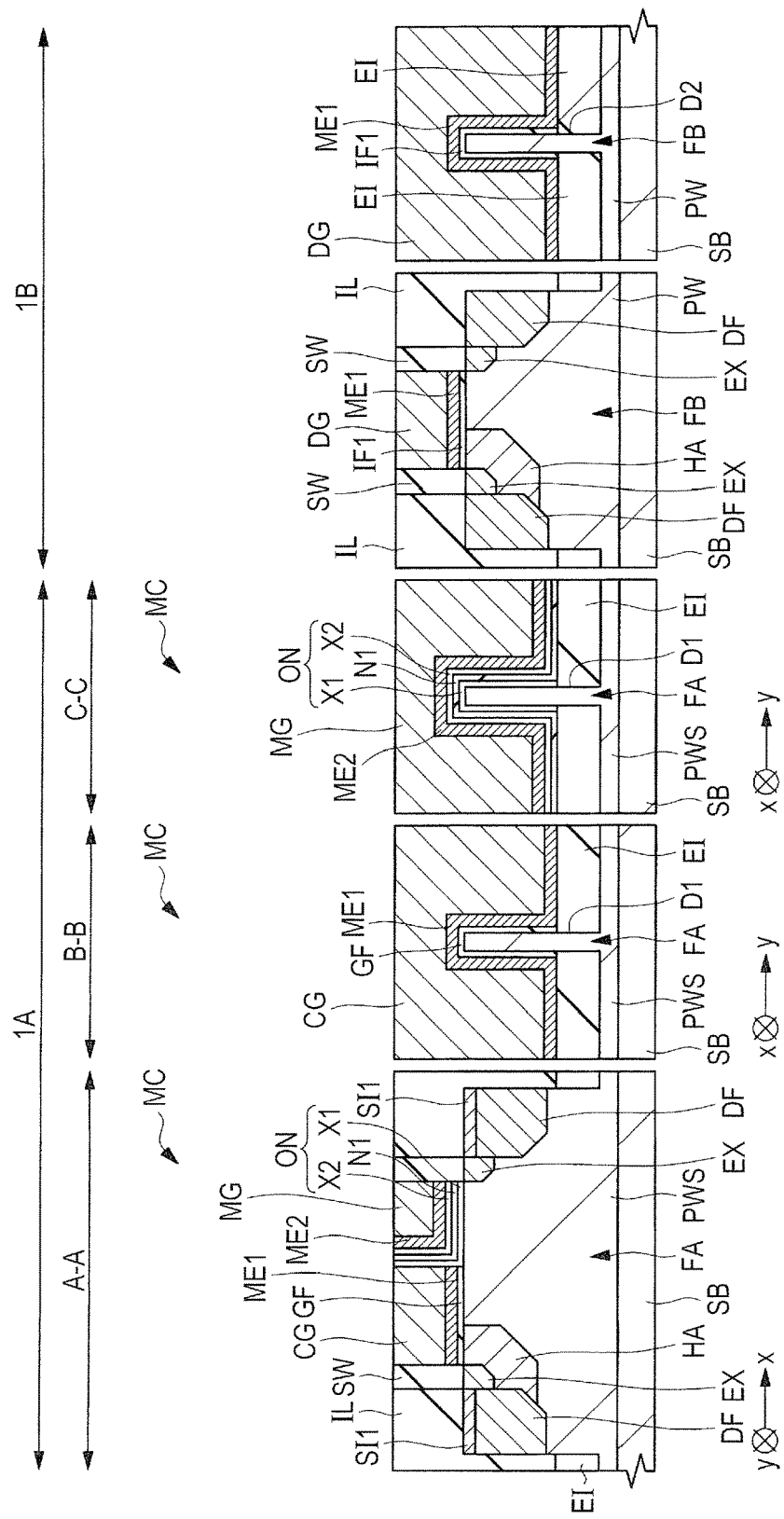
FIG. 20 is a cross sectional view for explaining a manufacturing process for the semiconductor device, following that of FIG. 19.

As illustrated in FIG. 20, the upper surface of the interlayer insulating film IL is planarized by polishing, using, for example, the CMP technique. The polishing process causes exposure of the upper surface of each of the control gate electrode CG, the memory gate electrode MG, and the dummy gate electrode DG. That is, planarization is performed, approximately in the same plane, for the upper surface of each of the control gate electrode CG, the memory gate electrode MG, and the dummy gate electrode DG, also the ONO film ON, the second metal film ME2, the sidewall spacer SW, and the interlayer insulating film IL. They are aligned at the same height. At this time, the silicide layer SI1 covering the upper surface of each of the control gate electrode CG and the memory gate electrode MG is removed.

This results in forming a split gate-type memory cell MC which is formed from the control gate electrode CG, the memory gate electrode MG, and a pair of source/drain regions which are formed on both sides of the pattern formed from the control gate electrode CG and the memory gate electrode MG. That is, there is formed a MONOS-type non-volatile memory cell which is formed from the selection transistor including the control gate electrode CG and the memory transistor including the memory gate electrode MG.

The control gate electrode CG of the memory cell region 1A extends, in the y direction, across the upper part of the fins FA, right over the fins FA and the element isolation region EI. Further, it is formed to be buried between the fins FA projecting from the element isolation region EI (see FIG. 1). The dummy gate electrode DG of the logic region 1B extends, in the y direction, across the upper part of the fins FB right over the fins FB and the element isolation region EI. It is formed to be buried between the fins FB projecting from the element isolation region EI.

Figure 21:
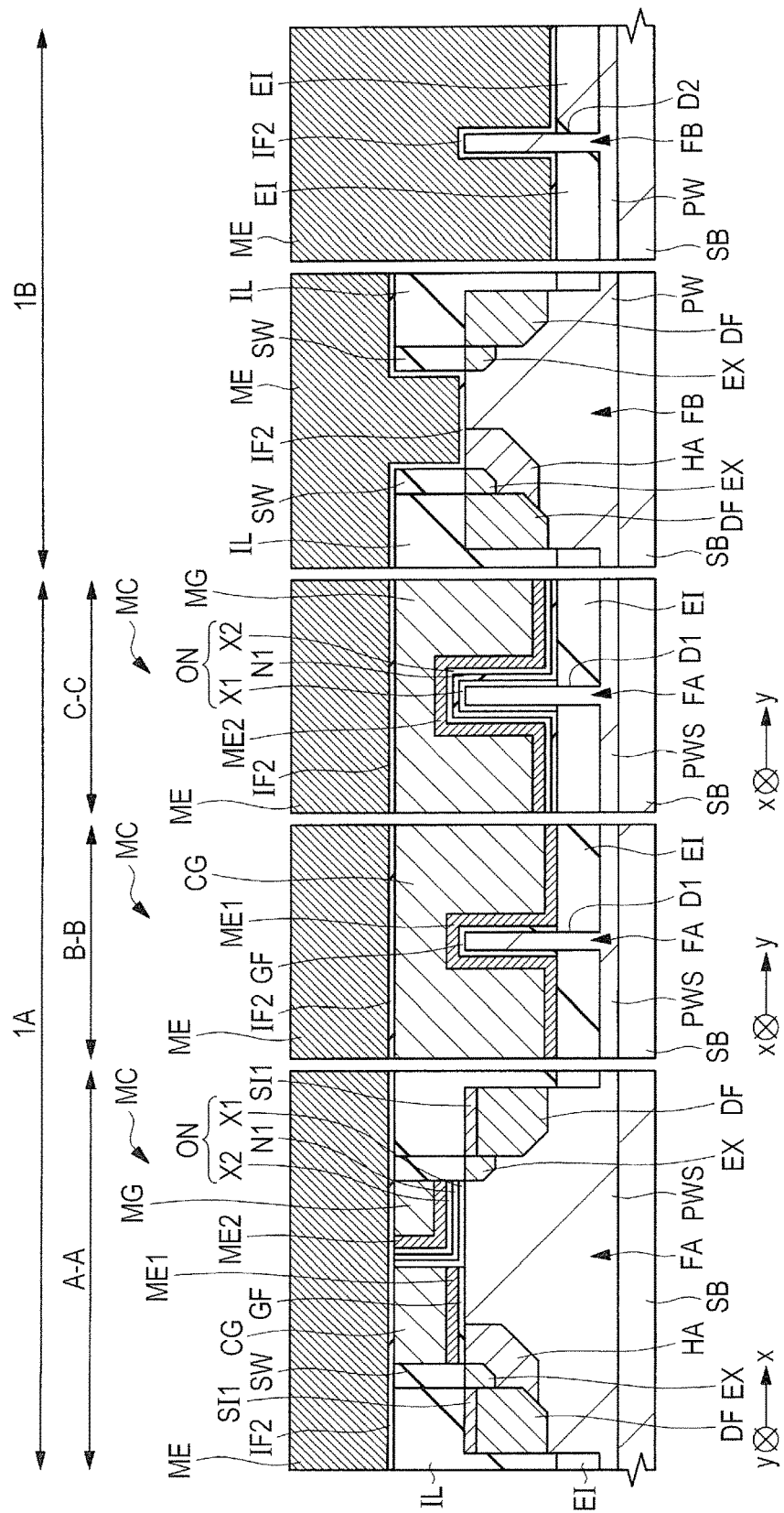
FIG. 21 is a cross sectional view for explaining a manufacturing process for the semiconductor device, following that of FIG. 20.

As illustrated in FIG. 21, the dummy gate electrode DG of the logic region 1B is removed by wet etching, in a state where the control gate electrode CG and the memory gate electrode MG of the memory cell region 1A are protected by the resist pattern (not illustrated). Subsequently, the first metal film EM1 and the insulating film IF1 are removed. In this case, the insulating film IF1 is not necessarily removed, and may be used as a part of a gate insulating film GI formed in the logic region 1B in the following process. In the above removing process, in the logic region 1B, a ditch is formed in the region where the dummy gate electrode DG and the insulating film IF1 are removed. After this, this resist pattern is removed.

After an insulating film IF2 is formed using, for example, an ALD (Atomic Layer Deposition) technique, over the semiconductor substrate SB, the metal film ME is formed using, for example, a sputtering technique. By so doing, a laminated film formed from the insulating film IF2 and the metal film ME is buried in the ditch.

Figure 22:
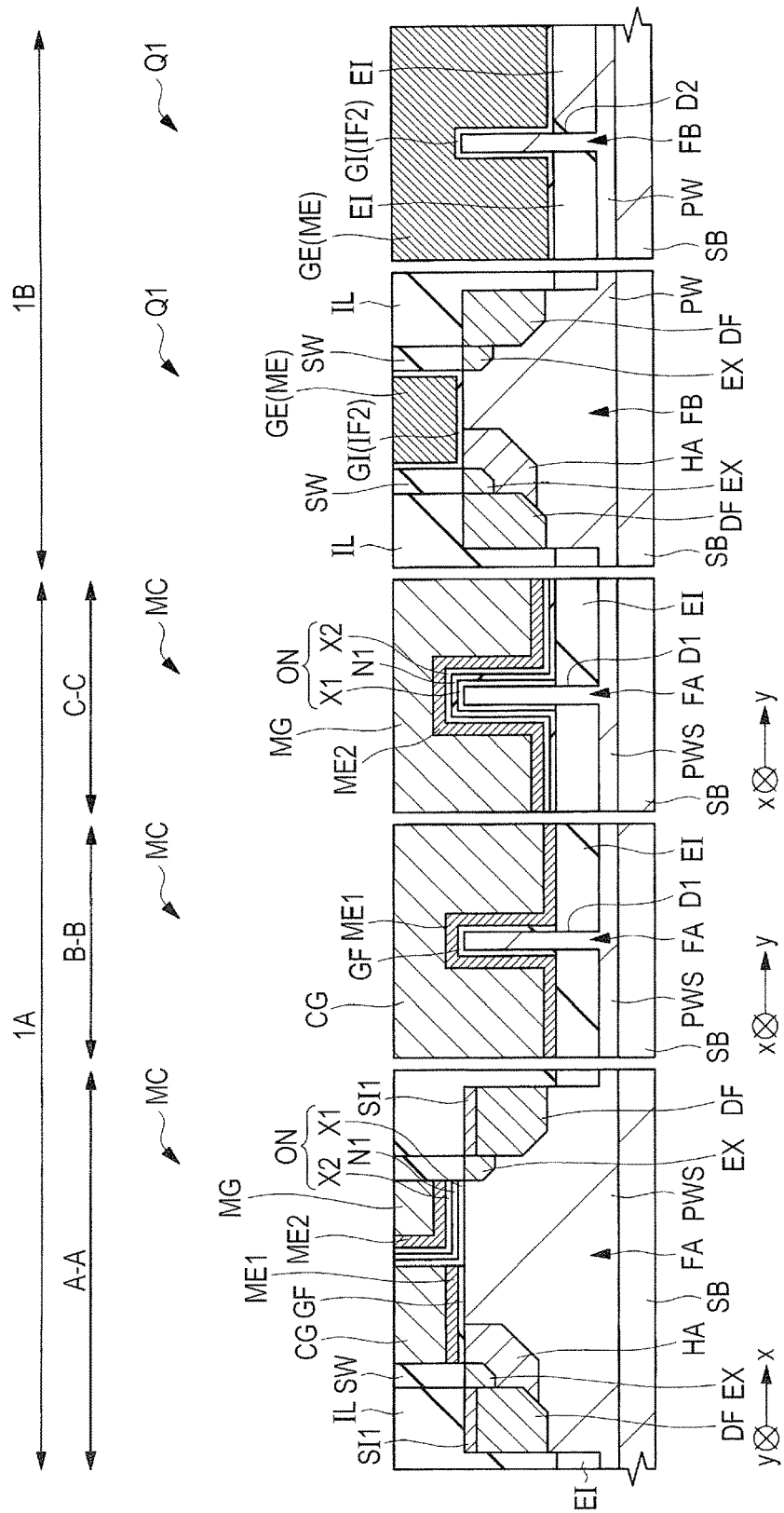
FIG. 22 is a cross sectional view for explaining a manufacturing process for the semiconductor device, following that of FIG. 21.

As illustrated in FIG. 22, any excessive insulating film IF2 and the excessive metal film ME on the interlayer insulating film IL are removed, by performing polishing, using the CMP technique. This causes exposure of the upper surface of each of the interlayer insulating IL, the control gate electrode CG, and the memory gate electrode MG. As a result, in the logic region 1B, there are formed the gate insulating film GI formed from the insulating film IF2 buried in the ditch and a gate electrode GE formed from the metal film ME buried in the ditch through the gate insulating film GI.

As a result, there is formed a transistor Q1 which is formed from the gate electrode GE and a pair of source/drain regions formed in the fin FB on both sides of the gate electrode GE. The transistor Q1 is a MISFET, with a low withstand voltage, driven by a voltage lower than that for the selection transistor or the memory transistor, and has a metal gate electrode. As the insulating film forming the gate insulating film GI, it is possible to use a metal oxide film, such as a hafnium oxide ($HfO_2$) film, a zirconium oxide ($ZrO_2$) film, an aluminum oxide ($Al_2O_3$) film, a tantalum oxide ($Ta_2O_5$) film, or a lanthanum oxide ($La_2O_3$) film. That is, the gate insulating film GI is a high-k film (a high dielectric constant film) whose dielectric constant is higher than that of the silicon oxide ($SiO_2$) film.

The metal film ME forming the gate electrode GE is formed of, for example, a laminated film of two layers. The laminated film has a lower metal film and an upper metal film which are sequentially laminated from the side of the semiconductor substrate SB. The lower metal film is formed from, for example, a titanium aluminum (TiAl) film, while the upper metal film is formed of, for example, aluminum (Al). The threshold voltage of the transistor Q1 may be adjusted by providing a titanium (Ti) film, a titanium nitride (TiN) film, or a laminated film thereof, between the lower metal film and the upper metal film. FIG. 21 and FIG. 22 illustrate the lower metal film and the upper metal film in the form of one metal film.

The gate insulating film GI covers the bottom surface and the side surface of the gate electrode GE, in the ditch. When the insulating film IF1 is removed in the process described using FIG. 21, an insulating film is newly formed on the bottom surface of the ditch, and this insulating film may be used as a part of the gate insulating film GI, by performing a thermal process before forming the gate insulating film GI. The descriptions have been made to the case where the high-k film is formed after removal of the dummy gate electrode DG. However, it is possible to form the high-k film after the process described using FIG. 8 and before the process (described using FIG. 12) for forming the polycrystalline silicon film PS1 included in the dummy gate electrode DG, and the high-k film may remain as the gate insulating film GI of the logic region 1B.

Figure 23:
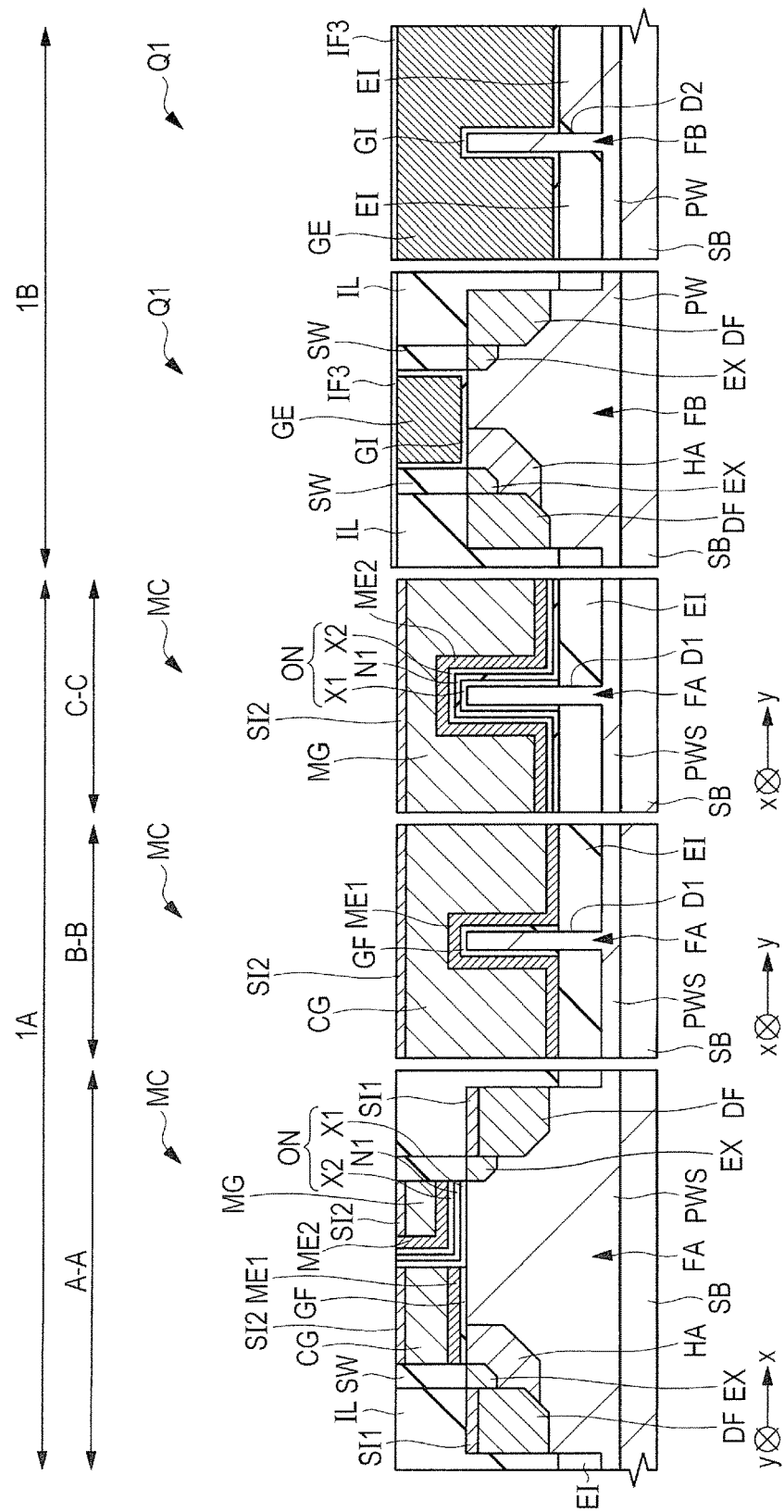
FIG. 23 is a cross sectional view for explaining a manufacturing process for the semiconductor device, following that of FIG. 22.

As illustrated in FIG. 23, after the upper surface of the gate electrode GE of the logic region 1B is covered by an insulating film IF3, there is formed a silicide layer SI2 covering the upper surface of the control gate electrode CG and the memory gate electrode MG.

The insulating film IF3 is formed from silicon oxide which is formed using, for example, the CVD technique. In this case, after the insulating film IF3 is formed to cover the memory cell region 1A and the logic region 1B, the insulating film IF3 of the memory cell region 1A is patterned, thereby being removed. As a result, there remains the insulating film IF3 covering the upper surface of each of the interlayer insulating film IL of the logic region 1B, the sidewall spacer SW, and the gate electrode GE.

A metal film which is formed from nickel (Ni) or cobalt (Co) is formed over the semiconductor substrate SB, using, for example, the sputtering technique. After this, a thermal process is performed to cause reaction between the metal film and the upper surface of each of the control gate electrode CG and the memory gate electrode MG. As a result, there is formed a silicide layer SI2 which covers the upper surface of each of the control gate electrode CG and the memory gate electrode MG, and which is formed of nickel silicide (NiSi) or cobalt silicide (CoSi).

The unreacted metal film is removed by wet etching. This results in exposing the interlayer insulating film IL and the insulating film IF3. In this case, because the gate electrode GE is covered by the insulating film IF3, it is possible to avoid removal of the gate electrode GE as a metal gate electrode by the wet etching. The silicide layer SI2 is not formed over the upper surface of the gate electrode GE.

After this, though not illustrated, an interlayer insulating film is formed over the interlayer insulating film IL. In addition, there are also formed a plurality of contact plugs (connection units), which penetrate through the interlayer insulating films and are coupled to the control gate electrode CG, the memory gate electrode MG, the source/drain regions, or the gate electrode GE. By forming these, the semiconductor device according to this embodiment is completed.

The descriptions have been made to the manufacturing method for the memory cell MC configured with the n-channel type MISEET, in accordance with the manufacturing method for the above-described semiconductor device. This method is applicable also to the memory cell configured with the p-channel type MISFET. In this case, the control gate electrode CG and the memory gate electrode MG are formed of the p-type polycrystalline silicon film, the first metal film ME1 on the side of the control gate electrode CG is formed of a relatively thin titanium nitride film, and the second metal film ME2 on the side of the memory gate electrode MG is formed of a relatively thick titanium nitride film. The thickness of the titanium nitride film forming the first metal film ME1 is approximately 1 nm to 5 nm.

In this manner, according to this embodiment, it is possible to enhance the threshold voltage of the control gate electrode CG, without increasing the impurity concentration of the fin FA. Thus, it is possible to maintain the effects that: the S value is low; there is only a small variation of the threshold voltages of the control gate electrode CG due to an impurity fluctuation; and the driving force is high.

<First Modification>

Figure 24:
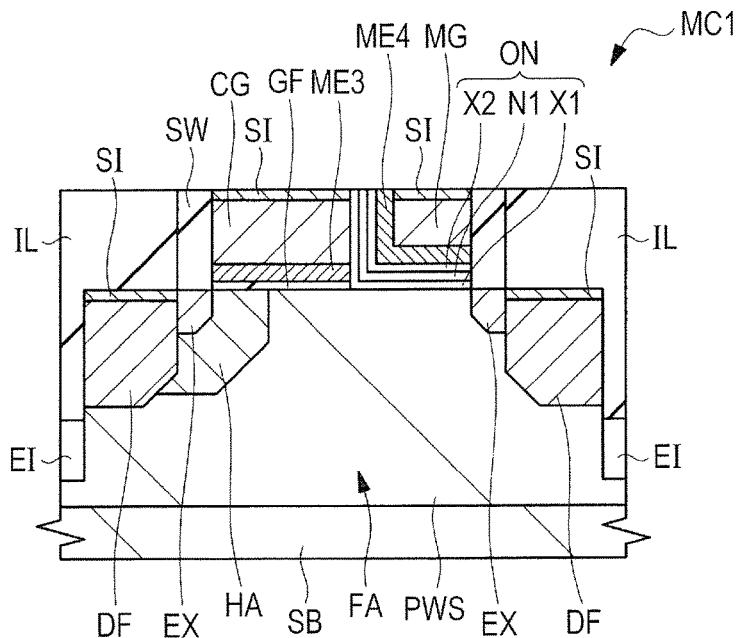
FIG. 24 is a cross sectional view showing a memory cell according to a first modification of the embodiment.
Figure 25:
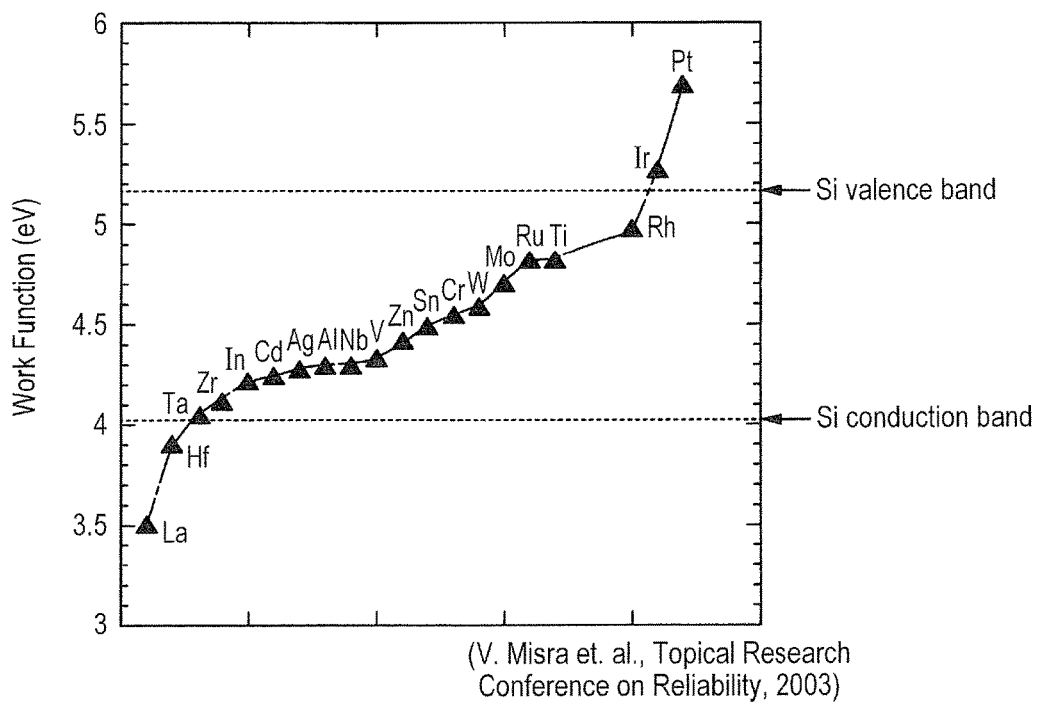
FIG. 25 is a graph diagram illustrating the work function of metal.

Descriptions will now be made to a semiconductor device according to a first modification of this embodiment, using FIG. 24 and FIG. 25. FIG. 24 is a cross sectional view of a memory cell according to the first modification of this embodiment. FIG. 25 is a graph diagram illustrating the work function of metal.

In the memory cell MC configured with the n-channel type MISFET according to the above-described embodiment, in the selection transistor, the first metal film ME1 having the first work function is formed between the control gate electrode CG and the gate insulating film GF, while, in the memory transistor, the second metal film ME2 having the second work function lower than the first work function is formed between the memory gate electrode MG and the ONO film ON (see FIG. 2 to FIG. 4). In this case, the first metal film ME1 and the second metal film ME2 are formed from the same metal material, for example, a titanium nitride film. The first work function is made greater than the second work function, by making the first metal film ME1 thicker than the thickness of the second metal film ME2.

As illustrated in FIG. 24, a memory cell MC1 configured with the n-channel type MISFET according to the first modification of this embodiment is substantially the same as the memory cell MC. That is, in the selection transistor, a third metal film ME3 having a third work function is formed between the control gate electrode CG and the gate insulating film GF, while, in the memory transistor, a fourth metal film ME4 having a fourth work function lower than the third work function is formed between the memory gate electrode MG and the ONO film ON. However, the third metal film ME3 and the fourth metal film ME4 are formed of different metal materials. By so doing, the third work function is made greater than the fourth work function.

As illustrated in FIG. 24, in the selection transistor, the control gate electrode CG is formed in (on) the upper surface and the sidewall of the fin FA exposed from the upper surface of the element isolation region EI, through the gate insulating film GF. Further, the third metal film ME3 having the third work function is formed between the gate insulating film GF and the control gate electrode CG. The selection transistor has a gate structure which is formed from the gate insulating film GF, the third metal film ME3, and the control gate electrode CG formed from the n-type polycrystalline silicon.

The third metal film ME3 has the third work function which is relatively high, equal to or greater than, for example, the intrinsic Fermi level (4.6 eV) of silicon. As a result, bending of the energy band on the side of the semiconductor substrate SB is reduced, thereby enhancing the threshold voltage of the selection transistor (enhancement type).

As illustrated in FIG. 24, in the memory transistor, the memory gate electrode MG is formed on the upper surface and the sidewall of the fin FA exposed from the upper surface of the element isolation region EI, through the ONO film ON. Further, the fourth metal film ME4 having the fourth work function is formed between the ONO film ON and the memory gate electrode MG. The memory transistor has agate structure configured with the ONO film ON, the fourth metal film ME4, and the memory gate electrode MG formed from the n-type polycrystalline silicon.

The fourth metal film ME4 has the fourth work function which is relatively low, that is, less than, for example, the intrinsic Fermi level (4.6 eV) of silicon. As a result, bending of the energy band on the side of the semiconductor substrate SB increases, thus decreasing the threshold voltage of the memory transistor (deplete type).

As illustrated in FIG. 25, the work functions of metal are different. The third metal film ME3 may be formed using, for example, molybdenum (Mo), ruthenium (Ru), titanium (Ti), rhodium (Rh), iridium (Ir), or platinum (Pt), whose work functions are equal to or greater than 4.6 eV. The fourth metal film ME4 may be formed using, for example, chromium (Cr), tin (Sn), zinc (Zn), vanadium (V), niobium (Nb), aluminum (Al), argentum (Ag), cadmium (Cd), indium (In), zirconium (Zr), tantalum (Ta), hafnium (Hf), or lanthanum (La), whose work functions are less than 4.6 eV. Note that the work functions of the third metal film ME3 and the fourth metal film ME4 may vary depending on their thicknesses. Thus, their thicknesses are necessarily optimized.

In the first modification of this embodiment, the memory cell MC1 is an n-channel type MISFET. The control gate electrode CG and the memory gate electrode MG are configured with the n-type polycrystalline silicon. Thus, as described above, as the third metal film ME3 on the side of the control gate electrode CG, a metal material whose work function is relatively great (for example, 4.6 eV or greater) has been selected. In addition, as the fourth metal film ME4 on the side of the memory gate electrode MG, a metal material whose work function is relatively low (for example, less than 4.6 eV) has been selected.

However, in the case where the memory cell MC1 is a p-channel type MISFET whose control gate electrode CG and memory gate electrode MG are configured with a p-type polycrystalline silicon film, a combination different from the above is applied. That is, as the third metal film ME3 on the side of the control gate electrode CG, a metal material whose work function is relatively low (for example, lower than 4.6 eV) has been selected. As the fourth metal film ME4 on the side of the memory gate electrode MG, a metal material whose work function is relatively great (for example, 4.6 eV or greater) has been selected.

The semiconductor device according to the first modification of this embodiment can be formed similarly with the manufacturing method for the semiconductor device which has been described using FIG. 7 to FIG. 23. That is, in the memory cell MC1, the third metal film ME3 and the fourth metal film ME4 are formed, in place of the first metal film ME1 and the second metal film ME2 of the memory cell MC.

In this manner, according to the first modification of this embodiment, the effect of the fin-type channel can be maintained, and there is a wide selection of the third work function of the third metal film ME3 and the fourth work function of the fourth metal film ME4. As a result, it is possible to obtain the effect of improving controllability of the threshold voltage.

<Second Modification>

Figure 26:
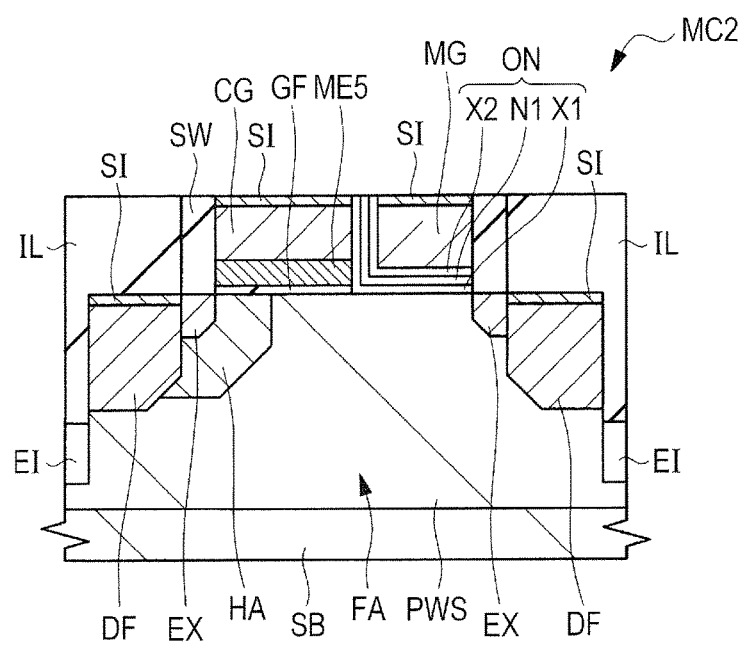
FIG. 26 is a cross sectional view showing a memory cell according to a second modification of the embodiment.
Figure 27A:
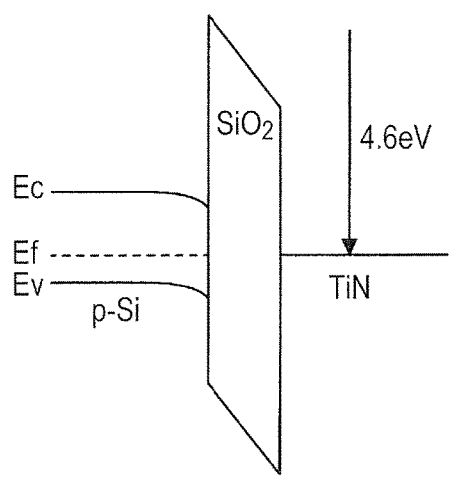
FIG. 27A is a band diagram illustrating a gate structure of a selection transistor according to the second modification of the embodiment.
Figure 27B:
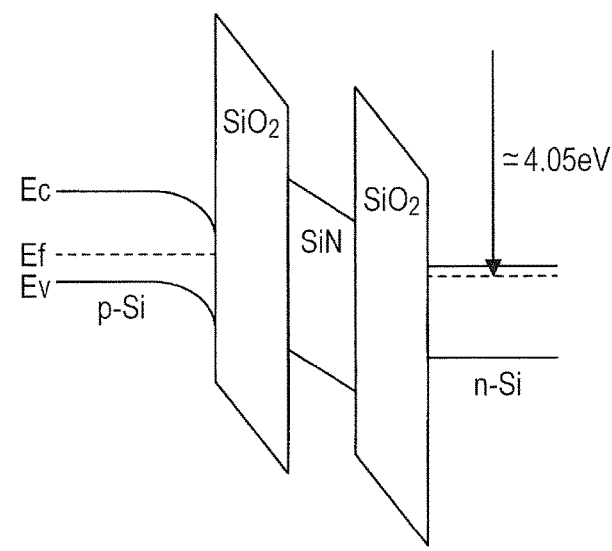
FIG. 27B is a band diagram illustrating a gate structure of a memory transistor.

Descriptions will now be made to a semiconductor device according to a second modification of this embodiment, using FIG. 26 and FIG. 27. FIG. 26 is a cross sectional view showing a memory cell along an extending direction of a fin, according to the second modification of this embodiment. FIG. 27A is a band diagram illustrating a gate structure of a selection transistor according to the second modification of this embodiment, and FIG. 27B is a band diagram showing a gate structure of a memory transistor.

What differs in a memory cell MC2 according to the second modification of this embodiment from the memory cell MC according to the above-described embodiment is the gate structure of the memory transistor.

As illustrated in FIG. 26, in the selection transistor, the control gate electrode CG is formed on the upper surface and the sidewall of the fin FA exposed from the upper surface of the element isolation region EI, through the gate insulating film GF. Further, a fifth metal film ME5 having a fifth work function is formed between the gate insulating film GF and the control gate electrode CG. The selection transistor has the gate structure which is configured with the gate insulating film GF, the fifth metal film ME5, and the control gate electrode CG formed from n-type polycrystalline silicon.

As illustrated in FIG. 27A, the fifth metal film ME5 has the fifth work function which is equal to or greater than 4.6 eV, that is, greater than, for example, the band level (4.05 eV) of the conduction band of silicon. Thus, bending of the energy band on the side of the semiconductor substrate SB is reduced, thus enabling to enhance the threshold voltage of the selection transistor (enhancement type). When the fifth metal film ME5 is formed of, for example, a titanium nitride film, its thickness is preferably approximately, for example, 5 nm to 50 nm.

As illustrated in FIG. 26, in the memory transistor, the memory gate electrode MG is formed on the upper surface and the sidewall of the fin FA exposed from the upper surface of the element isolation region EI, through the ONO film ON. However, no metal film is formed between the ONO film ON and the gate electrode MG. The memory transistor has a gate structure which is configured with the ONO film ON and the memory gate electrode MG formed from n-type polycrystalline silicon.

The work function of the n-type polycrystalline silicon forming the memory gate electrode MG is close to the band level (4.05 eV) of the conduction band of silicon, as illustrated in FIG. 27B. Thus, it is possible to decrease the threshold voltage of the memory transistor (deplete type).

In the second modification of this embodiment, the memory cell MC2 is an n-channel type MISFET, and the control gate electrode CG and the memory gate electrode MG are formed of n-type polycrystalline silicon. Thus, as described above, as the fifth metal film ME5 on the side of the control gate electrode CG, there has been selected a metal material whose work function is, for example, 4.6 eV, that is, greater than the band level (4.05 eV) of the conduction band of silicon.

However, when the memory cell MC2 is a p-channel type MISFET in which the control gate electrode CG and the memory gate electrode MG are formed of a p-type polycrystalline silicon film, as the fifth metal film ME5 on the side of the control gate electrode CG, there is selected a metal material whose work function is lower than the band level (5.1 eV) of the valance band of silicon, that is, equal to or lower than, for example, 4.6 eV. When the fifth metal film ME5 is formed of, for example, a titanium nitride film, its thickness is preferably approximately, for example, 1 nm to 5 nm.

In this manner, according to the second modification of this embodiment, the effect of the fin-type channel can be maintained, and no metal film is formed between the ONO film ON and the memory gate electrode MG. Thus, it is possible to obtain the effect of reducing the manufacturing process for the semiconductor device.

<Third Modification>

Figure 28:
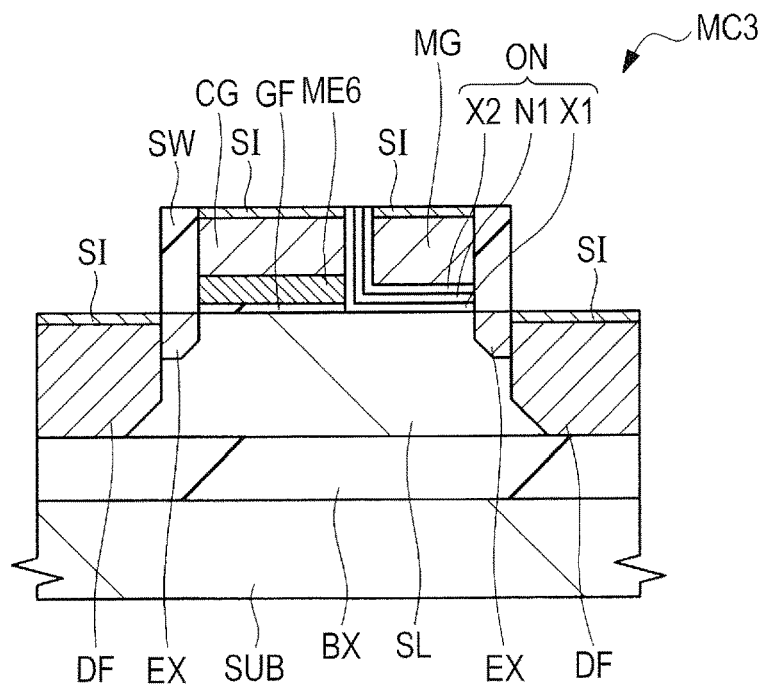
FIG. 28 is a cross sectional view showing a memory cell according to a third modification of the embodiment.

Descriptions will now be made to a semiconductor device according to a third modification of this embodiment, using FIG. 28. FIG. 28 is a cross sectional view showing a memory cell according to the third modification of this embodiment.

The memory cell MC according to the above embodiment is a part of the semiconductor substrate SB, and is formed on the upper part of the plate fin FA formed on the upper part of the semiconductor substrate SB (see FIG. 2 to FIG. 4). On the other hand, a memory cell MC3 according to the third modification of this embodiment is formed on an SOI (Silicon on Insulator) substrate.

As illustrated in FIG. 28, the memory cell MC 3 according to the third modification is formed on the main surface of the SOI substrate which is formed from a semiconductor substrate SUB formed from, for example, the p-type polycrystalline silicon, a BOX (Buried Oxide) layer BX formed from, for example, silicon oxide, and a semiconductor layer (also called an SOI layer) SL formed from p-type single crystal silicon formed over the BOX layer BX.

In the selection transistor, the control gate electrode CG is formed over a semiconductor layer SL through the gate insulating film GF. Further, a sixth metal film ME6 having a sixth work function is famed between the gate insulating film GF and the control gate electrode CG. The selection transistor has a gate structure which is configured with the gate insulating film GF, the sixth metal film ME6, and the control gate electrode CG formed from the n-type polycrystalline silicon.

The sixth metal film ME6 has the sixth work function which is greater than the band level (4.05 eV) of the conduction band of silicon, that is, equal to or greater than, for example, 4.6 eV. As a result, bending of the energy band on the side of the semiconductor substrate SUB is reduced, thus enabling to enhance the threshold voltage of the selection transistor (enhancement type). When the sixth metal film ME6 is formed of, for example, a titanium nitride film, its thickness is preferably approximately, for example, 5 nm to 50 nm.

In the memory transistor, the memory gate electrode MG is formed over the semiconductor substrate SL through the ONO film ON. However, no metal film is formed between the ONO film ON and the memory gate electrode MG. The memory transistor has a gate structure which is configured with the ONO film ON and the memory gate electrode MG which is formed from n-type polycrystalline silicon.

Because the work function of the n-type polycrystalline silicon forming the memory gate electrode MG is close to the band level (4.05 eV) of the conduction band of silicon, it is possible to lower the threshold voltage of the memory transistor (deplete type).

In this manner, according to the third modification of this embodiment, even when the memory cell MC3 is formed on the SOI substrate, it is possible to control the threshold voltage of the memory cell MC3 without increasing the impurity concentration of the semiconductor layer SL, thus enabling to realize optimization of the operational characteristic of the memory cell MC3.

<Fourth Modification>

Figure 29:
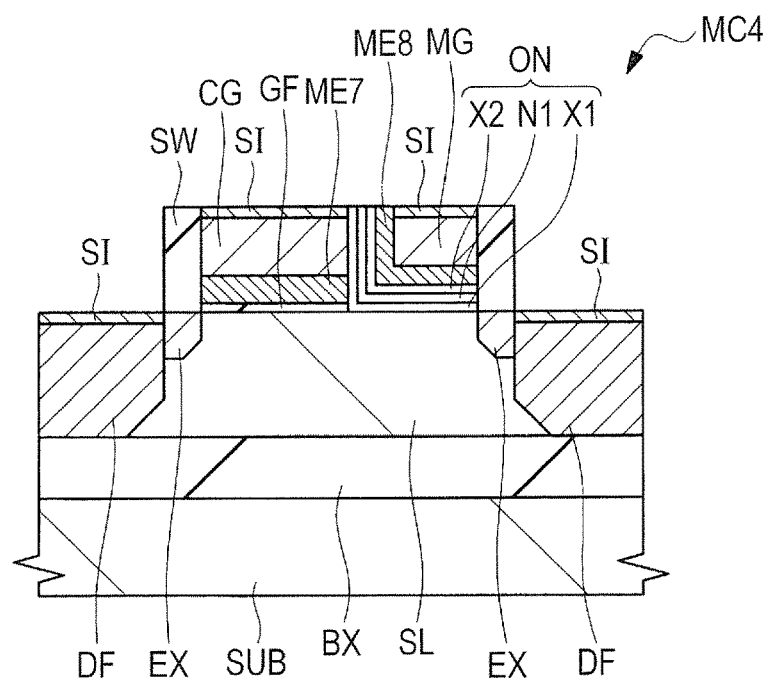
FIG. 29 is a cross sectional view showing a memory cell according to a fourth modification of the embodiment.

Descriptions will now be made to a semiconductor device according to a fourth modification of this embodiment, using FIG. 29. FIG. 29 is a cross sectional view showing a memory cell according to the fourth modification of this embodiment.

The memory cell MC according to the above embodiment is a part of the semiconductor substrate SB, and formed on the upper part of the plate fin FA formed on the upper part of the semiconductor substrate SB (see FIG. 2 to FIG. 4). On the other hand, the memory cell according to the fourth modification of this embodiment is formed on the SOI substrate, like the above-described third modification.

As illustrated in FIG. 29, a memory cell MC4 according to the fourth modification is formed on the main surface of the SOI substrate, like the memory cell MC3 according to the third modification.

In the selection transistor, the control gate electrode CG is formed over the semiconductor layer SL through the gate insulating film GF. Further, a seventh metal film ME7 having a seventh work function is formed between the gate insulating film GF and the control gate electrode CG. The selection transistor has a gate structure which is configured with the gate insulating film GF, the seventh metal film ME7, and the control gate electrode CG formed from n-type polycrystalline silicon.

The seventh metal film ME7 has the seventh work function which is relatively great, that is, equal to or greater than, for example, the intrinsic Fermi level (4.6 eV) of silicon. As a result, bending of the energy band on the side of the semiconductor substrate SUB is reduced, thereby enhancing the threshold voltage of the selection transistor (enhancement type).

In the memory transistor, the memory gate electrode MG is formed over the semiconductor layer SL through the ONO film ON. Further, an eighth metal film ME8 having an eighth work function is formed between the ONO film ON and the memory gate electrode MG. The memory transistor has a gate structure which is configured with the ONO film ON, the eighth metal film ME8, and the memory gate electrode MG formed from n-type polycrystalline silicon.

The eighth metal film ME8 has the eighth work function which is relatively low, that is, lower than, for example, the intrinsic Fermi level (4.6 eV). As a result, bending of the energy band on the side of the semiconductor substrate SUB is increased, thereby lowering the threshold voltage of the memory transistor (deplete type).

The seventh metal film ME7 and the eighth metal film ME8 may be formed of the same metal material, for example, a titanium nitride film, or may be formed of different metal materials. When the seventh metal film ME7 and the eighth metal film ME8 are formed of a titanium nitride film, the thickness of the seventh metal film ME7 is thicker than the thickness of the eighth metal film ME8, that is, approximately 5 nm to 50 nm.

In this manner, according to the fourth modification of this embodiment, even when the memory cell MC4 is formed on the SOI substrate, it is possible to control the threshold voltage of the memory cell MC4 without enhancing the impurity concentration of the semiconductor layer SL. Thus, it easily facilitates optimization of the operational characteristic of the memory cell MC4.

Accordingly, the descriptions have specifically been made to the inventions made by the present inventors based on the embodiment. However, the present invention is not limited to the above-described embodiment. Various changes may possibly be made without departing from the scope thereof.

The present invention includes the following preferred embodiment.

[Additional Note 1]

A semiconductor device having a memory cell including, in a first region of a p-type semiconductor substrate:

a plurality of first projection units which are a part of the semiconductor substrate, and extend in a first direction along a main surface of the semiconductor substrate;

a first gate electrode which is formed over an upper surface and a sidewall of the projection units through a first insulating film, and extends in a second direction orthogonal to the first direction along the main surface of the semiconductor substrate;

a second gate electrode which is formed adjacent to one side surface of the first gate electrode, and extends in the second direction;

a second insulating film which is formed between the first gate electrode and the second gate electrode and between the first projection units and the second gate electrode, and includes a charge accumulation film; and an n-type first source/drain regions which are formed in the first projection units in a position on one side of the first direction of the first gate electrode and on an opposed side of the second gate electrode and in the first projection units in a position on one side of the first direction of the second gate electrode and on an opposed side of the first gate electrode, wherein the first gate electrode and the second gate electrode are formed from n-type polycrystalline silicon, wherein a metal film is provided between the first insulating film and the second gate electrode, and wherein a work function of the metal film is greater than 4.05 eV.

[Additional Note 2]

The semiconductor device according to the additional note 1, wherein the metal film is formed from titanium nitride, and wherein a thickness of the metal film is equal to or greater than 5 nm and equal to or lower than 50 nm.

[Additional Note 3]

A semiconductor device having a memory cell including:

in a first region of an n-type semiconductor substrate, a plurality of first projection units which are a part of the semiconductor substrate, and extend in a first direction along a main surface of the semiconductor substrate;

a first gate electrode which is formed over an upper part and a sidewall of the first projection units through a first insulating film, and extends in a second direction orthogonal to the first direction along the main surface of the semiconductor substrate;

a second gate electrode which is adjacent to one side surface of the first gate electrode, and extends in the second direction;

a second insulating film which is formed between the first gate electrode and the second gate electrode and between the first projection units and the second gate electrode, and includes a charge accumulation film; and a p-type first source/drain regions which are formed in the first projection units in a position on one side of the first direction of the first gate electrode and on an opposed side of the second gate electrode and in the first projection units in a position on one side of the first direction of the second gate electrode and on an opposed side of the first gate electrode, wherein the first gate electrode and the second gate electrode are formed from p-type polycrystalline silicon, wherein a metal film is provided between the first insulating film and the first gate electrode, and wherein a work function of the metal film is lower than 5.16 eV.

[Additional Note 4]

The semiconductor device according to the additional note 3, wherein the metal film is titanium nitride, and wherein a thickness of the metal film is equal to or greater than 1 nm and equal to or lower than 5 nm.

[Additional Note 5]

A semiconductor device having a memory cell including:

in a first region of an SOI substrate configured with a semiconductor substrate, a buried insulating film over the semiconductor substrate, and a p-type semiconductor layer over the buried insulating film, a first gate electrode which is formed over an upper surface of the semiconductor layer, and extends in a first direction along a main surface of the semiconductor layer;

a second gate electrode which is formed adjacent to one side surface of the first gate electrode, and extends in the first direction;

a second insulating film which is formed between the first gate electrode and the second gate electrode and between the semiconductor layer and the second gate electrode, and includes a charge accumulation film; and an n-type first source/drain regions which are formed in the semiconductor layer in a position on one side of the first gate electrode and on an opposed side of the second gate electrode and in the semiconductor layer in a position on one side of the second gate electrode and on an opposed side of the first gate electrode, wherein the first gate electrode and the second gate electrode are formed from n-type polycrystalline silicon, wherein a metal film is provided between the first insulating film and the first gate electrode, and wherein a work function of the metal film is greater than 4.05 eV.

[Additional Note 6]

The semiconductor device according to the additional note 5, wherein the metal film is titanium nitride, and wherein a thickness of the metal film is equal to or greater than 5 nm and equal to or lower than 50 nm.

[Additional Note 7]

A semiconductor device having a memory cell including:

in a first region of an SOI substrate which is configured with a semiconductor substrate, a buried insulating film over the semiconductor substrate, and a p-type semiconductor layer over the buried insulating film, a first gate electrode which is formed over an upper surface of the semiconductor layer through a first insulating film, and extends in a first direction along a main surface of the semiconductor layer;

a second gate electrode which is formed adjacent to one side surface of the first gate electrode, and extends in the first direction;

a second insulating film which is formed between the first gate electrode and the second gate electrode and between the semiconductor layer and the second gate electrode, and includes a charge accumulation film;

an n-type first source/drain regions which are formed in the semiconductor layer in a position on one side of the first gate electrode and on an opposed side of the second gate electrode and in the semiconductor layer in a position on one side of the second gate electrode and on an opposed side of the first gate electrode, wherein the first gate electrode and the second gate electrode are formed from n-type polycrystalline silicon, wherein a first metal film is provided between the first insulating film and the first gate electrode, and a second metal film is provided between the second insulating film and the second gate electrode, wherein a first work function of the first metal film is greater than a second work function of the second metal film.

[Additional Note 8]

The semiconductor device according to the additional note 7, wherein the first metal film and the second metal film are formed from titanium nitride, and wherein a thickness of the first metal film is greater than a thickness of the second metal film.

[Additional Note 9]

The semiconductor device according to the additional note 8, wherein the thickness of the first metal film is equal to or greater than 5 nm and equal to or lower than 50 nm.

[Additional Note 10]

The semiconductor device according to the additional note 9, wherein the first metal film is formed from molybdenum, ruthenium, titanium, rhodium, iridium, or platinum, and the second metal film is formed from chromium, tin, zinc, vanadium, niobium, aluminum, argentum, cadmium, indium, zirconium, tantalum, hafnium, or lanthanum.

What is claimed is:

1. A semiconductor device having a memory cell comprising:
    in a first region of a first conductive type semiconductor substrate,
    a plurality of first projection units, which are a part of the semiconductor substrate, and extend in a first direction along a main surface of the semiconductor substrate;
    a first gate electrode, which is formed over an upper surface and a sidewall of the first projection units through a first insulating film, and extends in a second direction orthogonal to the first direction along the main surface of the semiconductor substrate;
    a second gate electrode, which is formed adjacent to one side surface of the first gate electrode, and extends in the second direction;
    a second insulating film, which is formed between the first gate electrode and the second gate electrode and between the first projection units and the second gate electrode, and includes a charge accumulation film; and
    first source/drain regions, which are of a second conductive type different from the first conductive type, and are formed in the first projection units at a position on a side of the first gate electrode that is opposite the second gate electrode in the first direction and in the first projection units at a position on a side of the second gate electrode that is opposite the first gate electrode in the first direction,
    wherein the first gate electrode and the second gate electrode are formed from polycrystalline silicon, which is of the second conductive type,
    wherein a first metal film is provided between the first insulating film and the first gate electrode, and a second metal film is provided between the second insulating film and the second gate electrode,
    wherein a first work function of the first metal film and a second work function of the second metal film are different from each other,
    wherein the first conductive type is p-type, and the second conductive type is n-type,
    wherein the first work function is greater than the second work function,
    wherein the first metal film and the second metal film are formed of titanium nitride, and
    wherein a thickness of the first metal film is greater than a thickness of the second metal film.

2. The semiconductor device according to claim 1, wherein the thickness of the first metal film is equal to or greater than 5 nm and equal to or less than 50 nm.

3. The semiconductor device according to claim 1, having a transistor comprising:
    in a second region different from the first region of the semiconductor substrate,
    a plurality of second projection units, which are a part of the semiconductor substrate, and extend in a third direction along the main surface of the semiconductor substrate;
    a third gate electrode, which is formed over an upper surface and a sidewall of the second projection units through a third insulating film, and extends in a fourth direction orthogonal to the third direction along the main surface of the semiconductor substrate; and
    second source/drain regions, which are formed in the second projection units at positions on both sides of the third gate electrode in the third direction,
    wherein the third insulating film is an insulating film whose dielectric constant is higher than that of $SiO_2$, and
    wherein the third gate electrode includes metal.

4. A semiconductor device comprising:
    a semiconductor substrate having a main surface, a plurality of first projections extending in a first direction along the main surface, and a first conductivity type;
    a first insulating film formed on the first projections;
    a first metal film formed on the first insulating film;
    a first gate electrode formed on the first metal film;
    a second gate electrode formed over the first projections and adjacent to the first gate electrode;
    a second insulating film formed between the first projections and the second gate electrode, and between the first and second gate electrodes, the second insulating film including a charge accumulation film;
    a second metal film formed between the second gate electrode and the second insulating film; and
    a pair of source/drain regions formed in the first projections such that the first and second gate electrodes are between the pair of source/drain regions in plan view, and having a second conductivity type different from the first conductivity type,
    wherein the first and second gate electrodes are formed of polycrystalline silicon having the second conductivity type,
    wherein a work function of the first metal film is different than a work function of the second metal film, and
    wherein a thickness of the first metal film is different than a thickness of the second metal film.

5. The semiconductor device according to claim 4, wherein the first metal film is formed of a same material as the second metal film.

6. The semiconductor device according to claim 5, wherein the first metal film and the second metal film are formed of titanium nitride.

7. The semiconductor device according to claim 6,
    wherein the first conductivity type is p-type, and the second conductivity type is n-type, and
    the thickness of the first metal film is greater than the thickness of the second metal film.

8. The semiconductor device according to claim 7, wherein the thickness of the first metal film is between 5 nm and 50 nm, inclusive.

9. The semiconductor device according to claim 6,
    wherein the first conductivity type is n-type, and the second conductivity type is p-type, and
    the thickness of the first metal film is less than a thickness of the second metal film.

10. The semiconductor device according to claim 9, wherein the thickness of the first metal film is between 1 nm and 5 nm, inclusive.

* * * * *